United States Patent
Shuler, Jr.

(10) Patent No.: US 6,492,857 B2
(45) Date of Patent: Dec. 10, 2002

(54) METHOD AND APPARATUS FOR REDUCING THE VULNERABILITY OF LATCHES TO SINGLE EVENT UPSETS

(75) Inventor: Robert L. Shuler, Jr., Friendswood, TX (US)

(73) Assignee: The United States of America as represented by the United States National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 09/840,684

(22) Filed: Apr. 20, 2001

(65) Prior Publication Data

US 2001/0028269 A1 Oct. 11, 2001

Related U.S. Application Data

(62) Division of application No. 09/525,371, filed on Mar. 13, 2000, now Pat. No. 6,377,097.

(51) Int. Cl.[7] .............................................. H03K 3/037
(52) U.S. Cl. ...................................... 327/225; 327/407
(58) Field of Search ........................... 326/46, 37, 104; 327/47, 48, 49, 99, 142, 225, 407; 365/230.02, 230.06

(56) References Cited

U.S. PATENT DOCUMENTS

| | | | | |
|---|---|---|---|---|
| 5,440,252 A | * | 8/1995 | Lee | 327/47 |
| 5,461,649 A | * | 10/1995 | Bailey et al. | 327/28 |
| 5,604,452 A | * | 2/1997 | Huang | 327/99 |
| 5,671,183 A | * | 9/1997 | Soenen et al. | 365/189.12 |
| 5,712,992 A | * | 1/1998 | Hawkins | 395/877 |

* cited by examiner

Primary Examiner—Matthew Smith
Assistant Examiner—Paul Dinh
(74) Attorney, Agent, or Firm—Hardie R. Barr; James M. Cate

(57) ABSTRACT

A delay circuit includes a first network having an input and an output node, a second network having an input and an output, the input of the second network being coupled to the output node of the first network. The first network and the second network are configured such that: a glitch at the input to the first network having a length of approximately one-half of a standard glitch time or less does not cause the voltage at the output of the second network to cross a threshold, a glitch at the input to the first network having a length of between approximately one-half and two standard glitch times causes the voltage at the output of the second network to cross the threshold for less than the length of the glitch, and a glitch at the input to the first network having a length of greater than approximately two standard glitch times causes the voltage at the output of the second network to cross the threshold for approximately the time of the glitch.

A method reduces the vulnerability of a latch to single event upsets. The latch includes a gate having an input and an output and a feedback path from the output to the input of the gate. The method includes inserting a delay into the feedback path and providing a delay in the gate.

2 Claims, 21 Drawing Sheets

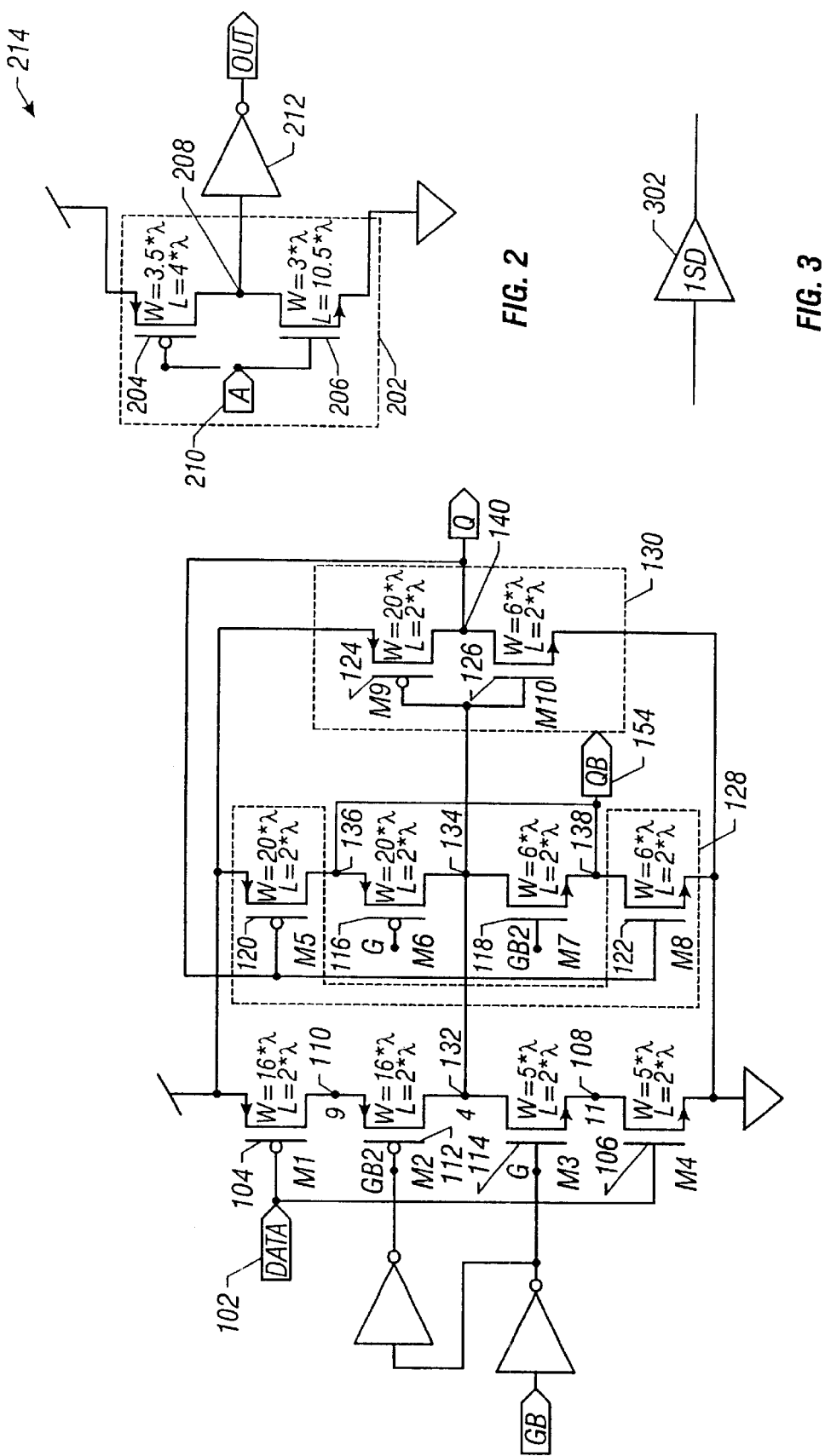

METHOD AND APPARATUS FOR REDUCING THE VULNERABILITY OF LATCHES TO SINGLE EVENT UPSETS

This application is a division of application Serial No. 09/525,371, filed Mar. 13, 2000 now U.S. Pat. No. 6,377,097.

ORIGIN OF THE INVENTION

The invention described herein was made by an employee of the United States Government and may be manufactured and used by or for the Government of the United States of America for governmental purposes without the payment of any royalties thereon or therefor.

FIELD OF THE INVENTION

This invention relates generally to the field of semiconductor electronics. More particularly, this invention relates to making semiconductor electronics less vulnerable to radiation. Even more particularly, this invention relates to reducing the vulnerability of latches to single event upsets.

BACKGROUND OF THE INVENTION

When an particle with sufficient energy passes through a semiconductor it creates electron-hole pairs along its path. If the electron-hole pairs occur in a sensitive region, such as the drains of N-type or P-type FETs, the electron-hole pairs generate a current that temporarily changes the voltage at the drain node in an occurrence called a "glitch." After a "recovery time," the electrons and holes generated by the passage of the particle are absorbed or carried away and the drain voltage returns to normal.

A glitch can be particularly disruptive to memory cells or latch circuits. Such circuits have feedback paths through which a glitch can be reinforced and stabilized before the node's recovery time has elapsed causing the node to stabilize in the glitch-induced state. Such an event is referred to as a single event upset or "SEU."

The latch circuit illustrated in FIG. 1 is an example of a circuit that is susceptible to an SEU. A Data signal is applied to Data terminal 102, which is coupled to the gates of P-type FET 104 and N-type FET 106. These FETs perform a buffer function isolating the input Data signal from the loads required to operate the flip flop. If the input Data signal is high (as that term is understood by persons of ordinary skill in the art) then FET 106 turns on pulling node 108 low. If Data is low, FET 104 turns on pulling node 110 high.

The signal GB (gate bar) determines whether the flip flop holds its current state (GB high) or tracks the input Data signal (GB low). FET's 112, 114, 116 and 118 are gating logic that configure the flip flop for storage (holding current state) or tracking, and FET's 120, 122, 124 and 126 are a pair of inverters (128 and 130, respectively) that accomplish the storage function.

With GB low, FET's 112 and 114 are "on", completing the path between the buffered Data nodes 108 and 110 and the coupling node 126. FET's 116 and 118 are "off", interrupting the feedback path that re-inforces storage. In this condition the state of the flip flop tracks the input Data signal until GB goes high again.

When the GB signal is high, the Q and QB outputs are maintained by a feedback loop composed of FETs 116 and 118 (which form a transmission gate), inverter 128 and inverter 130.

To illustrate the effect of a glitch on this circuit, suppose that the signal applied to the GB terminal is high, the Q output is high and the QB output is low. This means that nodes 132, 134, 136 and 138 are low and node 140 is high. Note that nodes 132 and 134 are the same physical node and that nodes 136 and 138 are the same physical node. If a glitch occurs at, for example, node 134 causing it to be driven high, inverter 130 will drive node 140 low. The signal at node 140 will be fed back to the input of inverter 128 which will drive nodes 136 and 138 high. If the feedback occurs before node 130 has a chance to recover from the glitch, node 134 will be driven high and an SEU will have occurred.

Glitches can occur in the latch, as discussed above, or they can be generated in logic outside the latch and propagate into the latch through a control line, for example, and cause an SEU.

Existing approaches to making circuits SEU-resistant include inserting resistors, capacitors or delay elements, such as inverters, in the feedback loop to slow the response of the loop to the glitch and thereby absorb it. Other approaches use redundancy and cross-coupled elements.

SUMMARY OF THE INVENTION

In general, in one aspect, the invention features a delay circuit comprising a first network having an input and an output node, a second network having an input and an output, the input of the second network being coupled to the output node of the first network. The first network and the second network are configured such that: a glitch at the input to the first network having a length of approximately one-half of a standard glitch time or less does not cause the voltage at the output of the second network to cross a threshold, a glitch at the input to the first network having a length of between approximately one-half and two standard glitch times causes the voltage at the output of the second network to cross the threshold for less than the length of the glitch, and a glitch at the input to the first network having a length of greater than approximately two standard glitch times causes the voltage at the output of the second network to cross the threshold for approximately the time of the glitch.

Implementations of the invention may include one or more of the following. The network may comprise a P-type FET and an N-type FET. The gates of the two FETs may be coupled together and the drains of the two FETs may be coupled together. The source of the P-type FET may be coupled to the power source and the source of the N-type FET being coupled to ground. The channel of at least one of the FETs may be non-linear. The channel of the at least one of the FETs may include a jog. The jog may be a right angle. The second network may be an inverter. The voltage at the output of the second network may cross the threshold after a delay relative to the arrival of the glitch at the input to the first network. The delay may be determined by characteristics of the first network and characteristics of the second network.

In general, in another aspect, the invention features an SEU-resistant circuit comprising a gate having an input and an output and a feedback path from the output of the gate to the input of the gate. The feedback path comprises two or more delay elements. The gate and the two or more delay elements are configured to absorb a standard glitch at the input to the gate before it propagates through the feedback path to the input of the gate. The delay is spread among the gate and the two or more delay elements.

Implementations of the invention may include one or more of the following. The delay may be substantially evenly spread among the gate and the two or more delay elements. The delay elements may comprise balanced gates. The feedback path may further comprise a driver gate. The delay elements may comprise inverters. The number of delay elements may be even.

In general, in another aspect, the invention features an SEU-resistant circuit having a first state and a second state. The SEU-resistant circuit comprises a first flip-flop having a first state and a second state. The first flip-flop is configured to change state upon application of a signal to a first flip-flop signal input. The SEU-resistant circuit also comprises a second flip-flop having a first state and a second state equivalent to the first state and the second state of the first flip-flop. The second flip-flop is configured to change state upon application of a signal to a second flip-flop signal input. The first flip-flop is coupled to the second flip-flop such that the SEU-resistant circuit does not change from its first state to its second state unless the state of the first flip-flop agrees with the state of the second flip-flop. The SEU-resistant circuit includes an input to receive a signal to cause the SEU-resistant circuit to change states when the signal changes states. The input is coupled to the first flip-flop signal input. The input is coupled to the second flip-flop signal input through a delay circuit. The input is for one of a clock, reset or preset signal.

Implementations of the invention may include one or more of the following. The delay circuit may be non-inverting. The delay circuit may have a delay greater than the maximum expected glitch time.

In general, in another aspect, the invention features a transition NAND gate comprising two or more input nodes, an output node, and a state machine responsive to the two or more input nodes. The state machine is in a current state when signals applied to the respective input nodes have specified values. The state machine is capable of transitioning from a most recent current state to a state that is not a current state. The output node stores the current state of the state machine.

Implementations of the invention may include one or more of the following. The output node may have parasitic capacitance and the output node may store the current state in its parasitic capacitance. The state machine may comprise a supply-side FET for each input terminal. The gate of each supply-side FET may be connected to a respective input terminal. The supply-side FETs may be connected in series. The series-connected supply-side FETs may have a supply end and an output end. The state machine may comprise a ground-side FET for each input terminal. The gate of each ground-side FET may be connected to a respective input terminal. The ground-side FETs may be connected in series. The series-connected ground-side FETs may have a ground end and an output end. The output end of the series-connected supply-side FETs may be connected to the output end of the series connected ground-side FETs to form an output terminal.

The supply-side FETs may be P-type FETs, and the ground-side FETs may be N-type FETs. The state machine may be in a first current state when signals connected to the input nodes are all high and in a second current state when signals connected to the input nodes are all low.

In general, in another aspect, the invention features an SEU-resistant flip-flop comprising a Data input, a GB input, and a network responsive to signals applied to the Data input and the GB input. The network has a Q1 output which has the value of the signal applied to the Data input when the signal applied to the GB input is low, and a Q2 output which has the value of the signal applied to the Data input D seconds after the signal applied to the GB input is low. The Q1 output of the network is coupled to a Q1 node and the Q2 output of the network is coupled to a Q2 node. The SEU-resistant flip-flop includes a two-input one-output TAG. The output of the TAG is configured to change state only if the value of the signal on its first input is the same as the value of the signal on its second input. The first input of the TAG is coupled to the Q1 node. The second input of the TAG is coupled to the Q2 node. The output of the TAG is coupled to a QB node. The SEU-resistant flip-flop includes a first slow inverter having its input coupled to the QB node and its output coupled to the Q1 node, and a second slow inverter having its input coupled to the QB node and its output coupled to the Q1 node.

Implementations of the invention may include one or more of the following. The SEU-resistant flip-flop may further comprise a transmission gate, gated by the value of the signal in the GB node, in a signal path between the first slow inverter and the Q1 node, and a transmission gate, gated by the value of the signal on the GB node, in a signal path between the second slow inverter and the Q2 node. The SEU-resistant flip-flop may further comprise an inverter coupled to the QB node.

The TAG may comprise series-connected P-type FETs. The gate of a first P-type FET may be coupled to the Q1 node. The gate of a second P-type FET may be coupled to the Q2 node. The series-connected P-type FETs may have a supply end and a connection end. The TAG may comprise two series-connected N-type FETs. The gate of a first N-type FET may be coupled to the Q1 node and the gate of a second N-type FET may be coupled to the Q2 node. The series-connected N-type FETs may have a ground end and a connection end. The connection end of the series-connected N-type FETs may be coupled to the connection end of the series-connected P-type FETs and to the QB node.

The P-type FET coupled to the Q2 node may be at the connection end of the series-connected P-type FETs. The N-type FET coupled to the Q2 node may be at the connection end of the series-connected N-type FETs.

The network may comprise a first inverter having its input coupled to the GB input. The output of the first inverter may be coupled to a G node. A delay G may have its input coupled to the G node. The output of the delay G may be coupled to a G2 node. An inverter may have its input coupled to the G2 node and its output coupled to a GB2 node. A first transmission gate may be coupled between the Data input and the Q1 node and gated by the signals on the GB and G nodes, and a second transmission gate may be coupled between the Data input and the Q2 node and gated by the signals on the GB2 and G2 nodes. The delay G may comprise a first delay coupled in series with a second delay. A buffer may be coupled between the Data input and the first and second transmission gates.

In general, in another aspect, the invention features a method for reducing the vulnerability of a latch to single event upsets. The latch comprises a gate having an input and an output and a feedback path from the output to the input of the gate. The method comprises inserting a delay into the feedback path, and providing a delay in the gate.

Implementations of the invention may include one or more of the following. The gate may comprise a first FET having a channel and a second FET having a channel. The channel of the first FET and the channel of the second FET may be coupled at a node having a parasitic capacitance. Providing may comprise adjusting the characteristics of the channel of the first FET, the characteristics of the channel of the second FET and the parasitic capacitance of the node. Adjusting may comprise increasing the length of the channel of the first FET. Increasing may comprise making the channel non-linear. Making may comprise inserting a jog into the channel. The jog may be a right angle. The output of the gate may be coupled to a threshold device having an input, an output and a threshold. The output may have a first value when the input is less than the threshold and a second value when the input is greater than the threshold.

The method may further comprise adjusting the time constant and the threshold so that a glitch of length L1 at the input to the gate would not effect the output of the threshold device, a glitch of length L2, L1<L2<L3, would cause a pulse of length L4<L2 to appear at the output of the threshold device after a delay determined by the time constant and the threshold, and a glitch of length L5>L3 would cause a pulse of length approximately L5 to appear at the output of the threshold device after a delay determined by the time constant and the threshold.

BRIEF DESCRIPTION OF THE DRAWINGS

FIG. 1 is a schematic of a prior art latch.

FIG. 2 is a schematic of an embedded delay and a compact standard delay according to the present invention.

FIG. 3 is a representation of a symbol for a compact standard delay.

DESCRIPTION OF THE PREFERRED EMBODIMENTS

Figure 4:
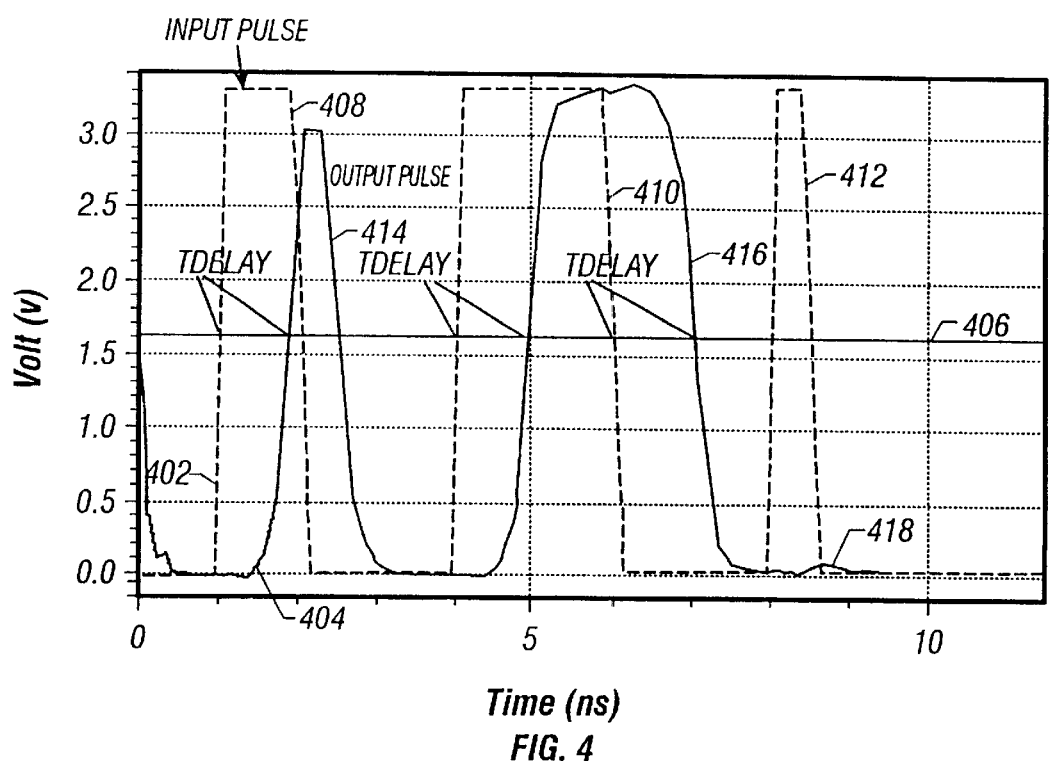
FIG. 4 is a chart showing the response of a compact standard delay according to the present invention to various glitches.

An "embedded delay" and a "compact standard delay," both illustrated in FIG. 2, provide building blocks for SEU-resistant circuits. An embedded delay 202 comprises a P-type FET 204 and an N-type FET 206 coupled at node 208. An input terminal 210 receives signals for the embedded delay 202. The parameters of the embedded delay's FETs 204 and 206 may be adjusted to create a desired time constant, which, when coupled with the threshold of the following circuit, cause the embedded delay to: (1) suppress entirely input pulses shorter than a first length, (2) delay and shorten (or filter) input pulses between the first length and a second length and (3) delay without substantially modifying pulses longer than the second length. The embedded delay 202 can be designed into a circuit where the characteristics of the following circuit are under the designer's control. Where this condition is not met or where the designer desires to insert a delay without disrupting the rest of the circuit, an inverter 212 with known and controllable characteristics can be coupled to the output node 208 of the embedded delay 202, to create a compact standard delay 214. A symbol 302 for the compact standard delay is illustrated in FIG. 3. The parameters of the embedded delay's FETs 204 and 206 and the threshold of the inverter 212 determine the compact standard delay's 214 delay and filtering characteristics.

The figures show the FET channel dimensions, length (L) and width (W), relative to lambda, represented by "1" or "8." Lambda is one half the minimum gate length, which means that the minimum gate length will be 2≅lambda. For some scalable design rules, lambda may deviate slightly. The examples described herein are for an HP 0.5: (0.5 micron) N-well process with lambda=0.3 micron, and nominal load fanout of 10, giving a worst case propogation delay of 1 ns (nanosecond). It will be understood by persons of ordinary skill in the art that a conversion into any particular process may require scaling in order to achieve the required timing properties. In many cases, such a conversion requires little or no adjustment to the lambda-relative dimensions.

The switching and filtering functions of the embedded delay 214 shown in FIG. 2 are illustrated in FIG. 4. Curve 402 is a representation of an input signal applied to input terminal 210 and curve 404 is a representation of the resulting output signal that appears at node 208. Level 406 represents the input switching threshold of inverter 212. The input signal 402 includes a 1 ns pulse 408, a 2 ns pulse 410, and a 0.5 ns pulse 412. The response of the compact standard delay 202 to the 1 ns pulse 408 is a pulse 414, which crosses the threshold 406 $t_{delay}$ ns after the input pulse 408 and crosses the threshold again less than 1 ns later. The output of the inverter 212 will be a delayed and filtered version of the input pulse.

The response of the compact standard delay 214 to the 2 ns pulse is a pulse 416, which crosses the threshold 406 $t_{delay}$ ns after the input pulse 408 and crosses the threshold again approximately 2 ns later. The output of the inverter 212 will be a delayed, but otherwise not much affected, version of the input pulse.

The response of the compact standard delay 214 to the 0.5 ns pulse is a pulse 418, which never crosses the threshold. The output of the inverter 212 will be unaffected by the input pulse.

Thus, as shown in FIG. 4, the circuit shown in FIG. 2 will filter out glitches of length less than approximately one-half $t_{delay}$, reduce the length of glitches of length less than approximately twice $t_{delay}$, and leave generally unaffected input pulses having lengths greater than approximately twice $t_{delay}$.

Figure 5A:
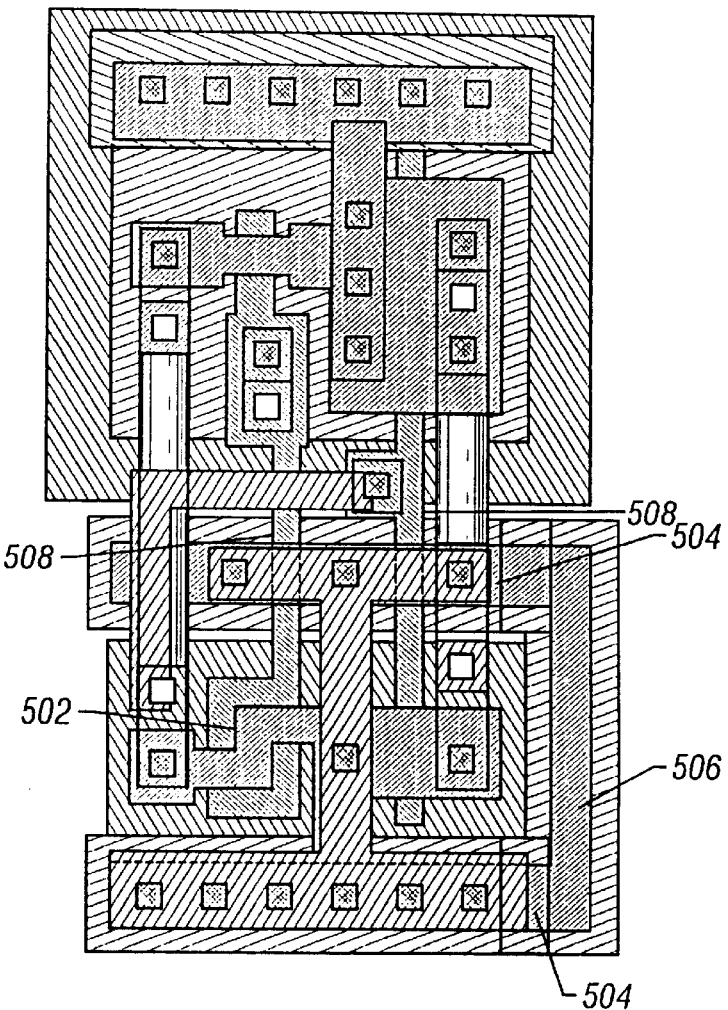
FIGS. 5A and 5B are a layout for a compact standard delay according to the present invention and a key to the layout.
Figure 5B:
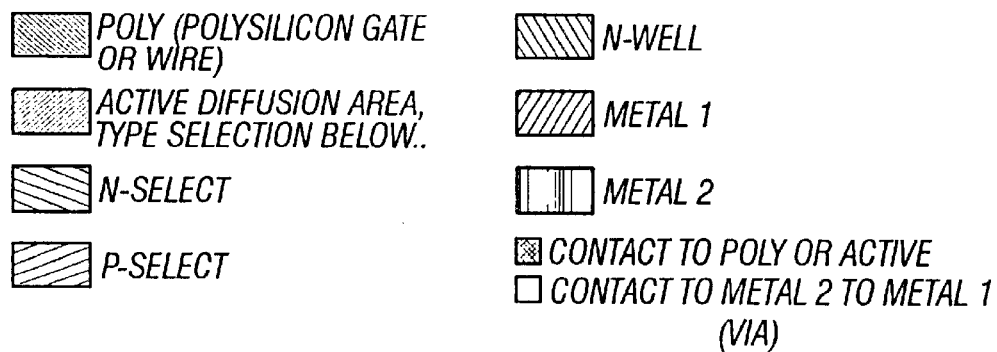

One way to create the FET characteristics necessary to produce the results shown in FIG. 4 is to increase the length of an FET channel. This can be accomplished without significantly increasing the footprint of the FET by changing the geometry of the channel, for example by inserting right angles into the channel 502, as shown in FIG. 5A. FIG. 5B is a legend for the layers shown in FIG. 5A. Two P-type guard bars 504 provide protection against latchup and are arranged to be continuous if two like circuits are placed side by side. A row end cap 506 is provided to connect the bars adjacent to the end-most circuit. The circuit also allows polysilicon gates or wires to cross the guard bars, as shown at locations 508, provided substrate contact is maintained on both sides of the crossing, also shown.

Figure 6:
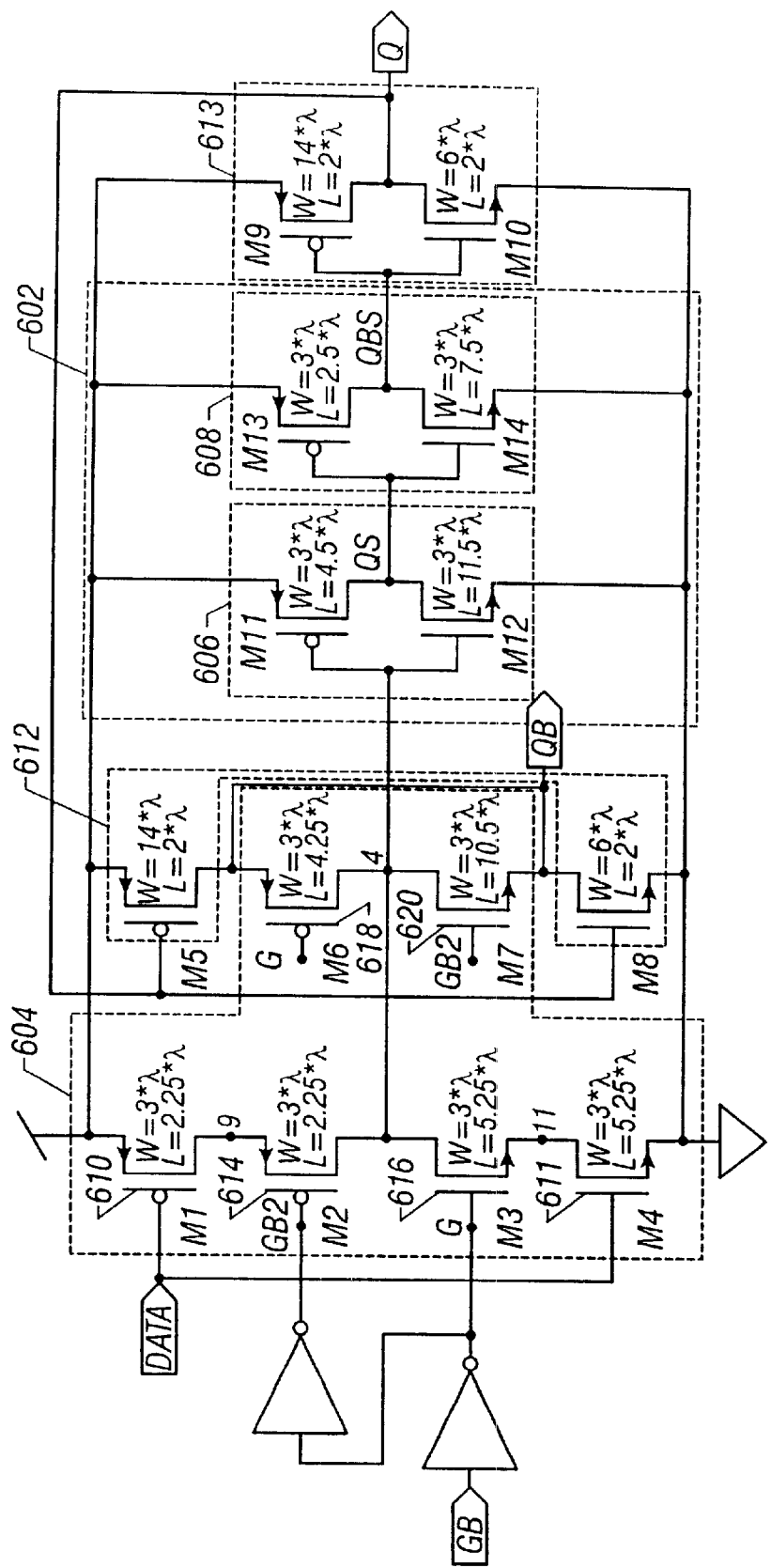
FIG. 6 is a schematic of a latch incorporating compact standard delays according to the present invention.

An SEU-resistant latch which modifies and builds upon the latch illustrated in FIG. 1 by incorporating the concept of the embedded delay is illustrated in FIG. 6. The SEU-resistant latch includes an added portion 602 and a modified portion 604. The added portion includes two embedded delays 606 and 608 within the feedback path discussed above in relation to FIG. 1 and a third delay created by the modified portion 604 The two compact embedded delays 606 and 608 are sized to provide filtering and delay functions as described above.

Further, the channel dimensions of the FETs within portion 604 shown in FIG. 6 have been modified as compared to the same FETs shown in FIG. 1 to provide additional and delay:

| FIG. 1 (prior art) | | | FIG. 6 | | |
|---|---|---|---|---|---|
| FET | Dimension | 8 | 8 | Dimension | FET |
| 104 | W | 16 | 3 | W | 610 |
|  | L | 2 | 2.25 | L |  |
| 106 | W | 5 | 3 | W | 612 |
|  | L | 2 | 5.25 | L |  |
| 112 | W | 16 | 3 | W | 611 |
|  | L | 2 | 2.25 | L |  |
| 114 | W | 5 | 3 | W | 616 |
|  | L | 2 | 5.25 | L |  |
| 116 | W | 20 | 3 | W | 618 |
|  | L | 2 | 4.25 | L |  |
| 118 | W | 6 | 3 | W | 620 |
|  | L | 2 | 10.5 | L |  |

The modifications to FETs 618 and 620 cause them to operate as an embedded delay. The addition of embedded delays 606 and 608 provide three elements of delay in the feedback path which are adjusted as a group to filter out glitches approximately one "standard glitch" time in length.

A "standard glitch" time is the typical worst case radiation induced glitch width for the particular design or logic family. This is approximately equal to the worst case gate propagation time, which may be taken to be the signal delay for the weakest gate loaded with the maximum allowed load (fan out). If a longer delay is used, a radiation-induced glitch occurring within the delay circuit itself will produce a longer glitch time. Therefore, a delay equal to the worst case glitch provides the maximum filtering without increasing the worst possible glitch time.

These performance characteristics are achieved in simulation by iteratively tweaking the FET parameters in the three delay elements, understanding that tweaking one of the delay elements will effect the preceding delay element, until the circuit is not sent into an SEU by a standard glitch. Simulation results indicate that this result is most readily achieved by spreading the desired delay roughly evenly among the three delay elements and by balancing the rise-time and fall-time delays for each of the delay elements.

Because there are three delay elements having delays equal to approximately a standard glitch time, no glitch having a length less than or equal to a standard glitch time is able to set a majority of the following nodes in the feedback path, nor its own driving node, before being corrected by the driving node. A glitch approximately the length of a standard glitch or shorter will be delayed and shortened by each delay element until it is finally absorbed before it proceeds all the way around the loop.

The modifications to FETs 610, 611, 614 and 616 ensure that there are at least three elements of delay in the path from any input to the complete setting of all nodes. These modifications protect against glitches on the clock (GB) input and on the Data input.

The incorporation of three delay elements in the feedback loop in FIG. 6 is accomplished by only adding two inverters 606 and 608. The remaining delay is spread over pre-existing components by adjusting the physical parameters of those components as described above for the embedded delay. In FIG. 6, the delay is spread over three components. It will be understood by persons of ordinary skill in the art that the delay can be spread over additional components and achieve the same result. It will also be understood by persons of ordinary skill in the art that the location of the delay elements is not important as long as they are in the feedback loop. For example, embedded delay 608 could be moved to between the Q node and the input to inverter 612, with appropriate adjustments to the delay elements.

Figure 7A:
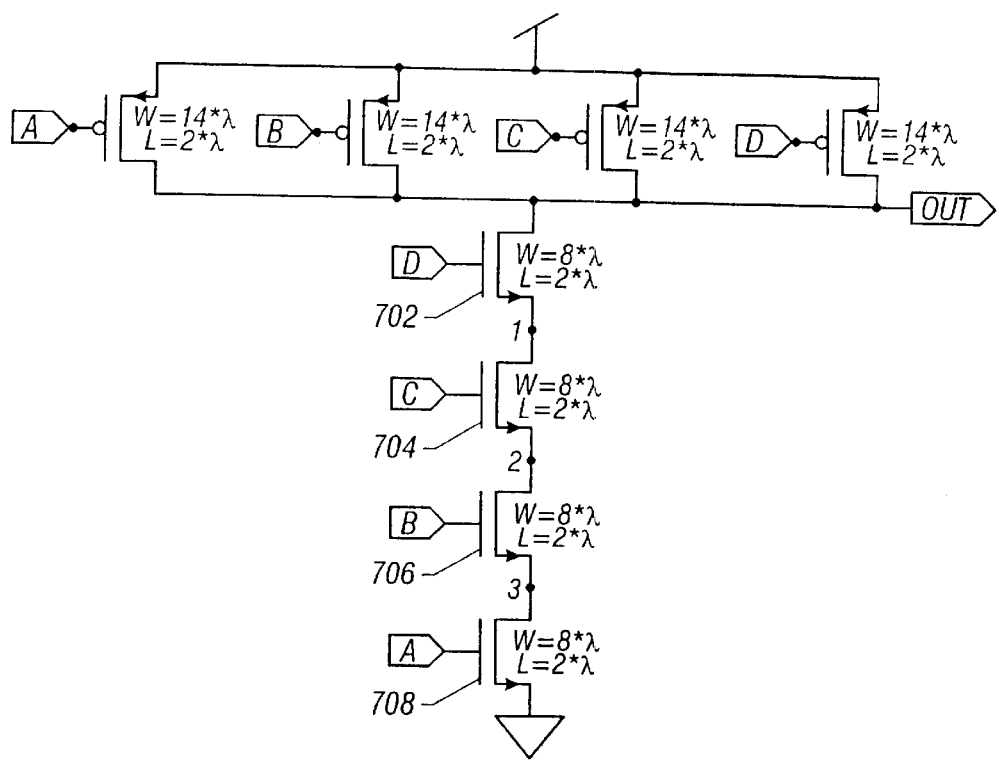
FIG. 7A is a schematic of a prior art logic gate.
Figure 7B:
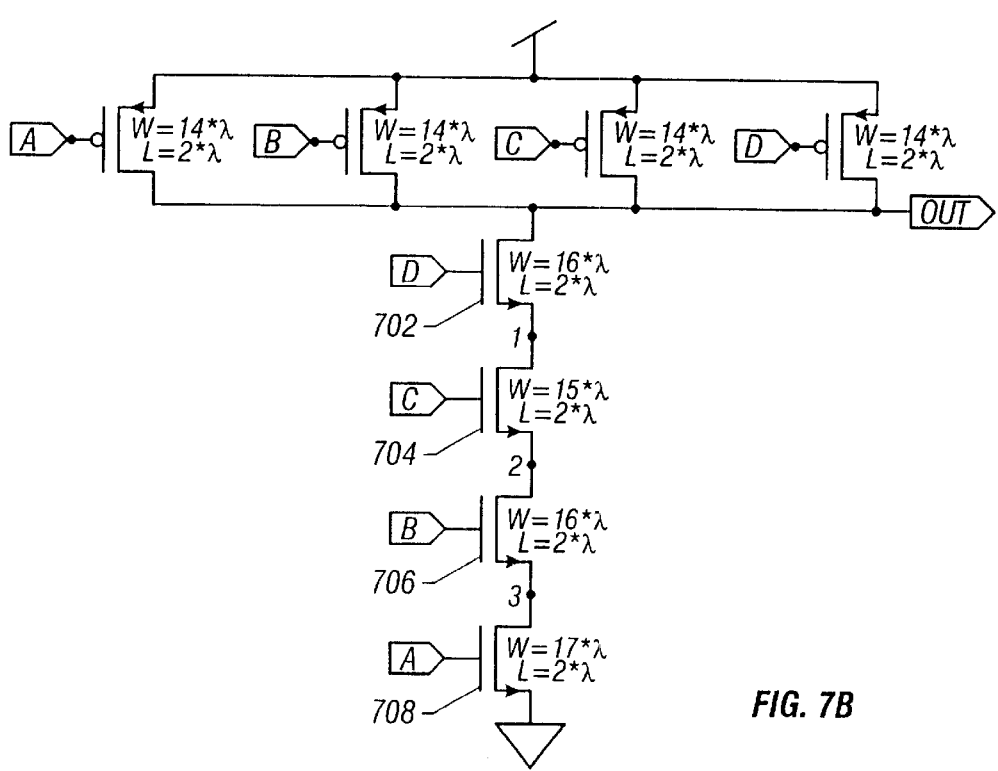
FIG. 7B is a schematic of a balanced logic gate according to the present invention.

Glitch resistance is assured in circuits such as the circuit illustrated in FIG. 6 by adhering to the following design rules: (a) strictly follow the loading rules for the logic family, and simulate any long connections to make sure no non-standard glitches can occur, and (b) use rise/fall time balanced logic gates to make sure no standard glitch is subsequently spread to a longer width. A conventional 4-input NAND gate is illustrated in FIG. 7A and a balanced version of the same circuit is illustrated in FIG. 7B. The channel width, W, of each of the N-type FETs 702, 704, 706 and 708 has been increased to balance the fall time of the illustrated gate with its rise time.

Further glitch-resistance may be achieved by using a third design rule: (c) a latch should be clocked with a data setup time approximately two standard glitch times longer than the minimum required time to change the state of the latch, and a hold time approximately one standard glitch time longer. The clock dwell time (GB low) should also be at least two standard glitch times longer. This allows the latch to recover and capture correct data no matter where the glitch occurs in the clocking cycle, on either the Data or clock (GB) inputs, or on one of the latch's internal nodes.

Figure 8:
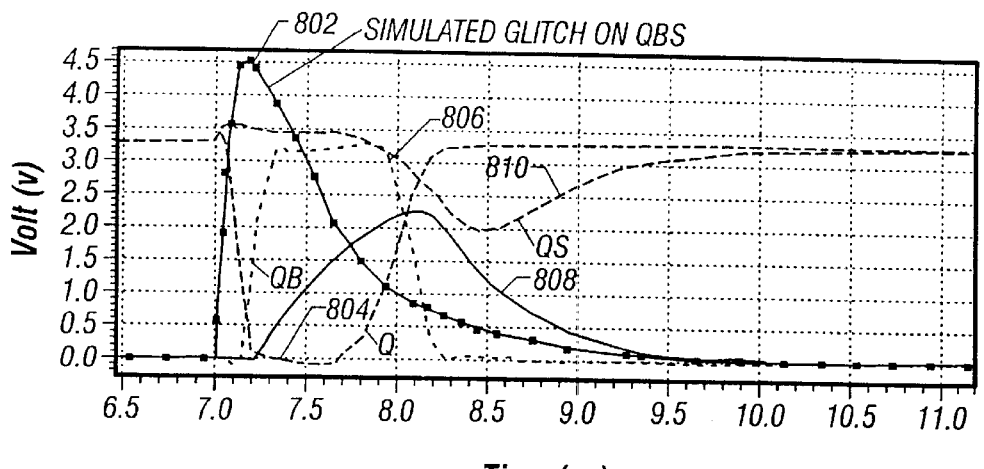
FIGS. 8 and 9 are charts showing the responses of the latch of FIG. 6 to glitches on various nodes of the circuit.
Figure 9:
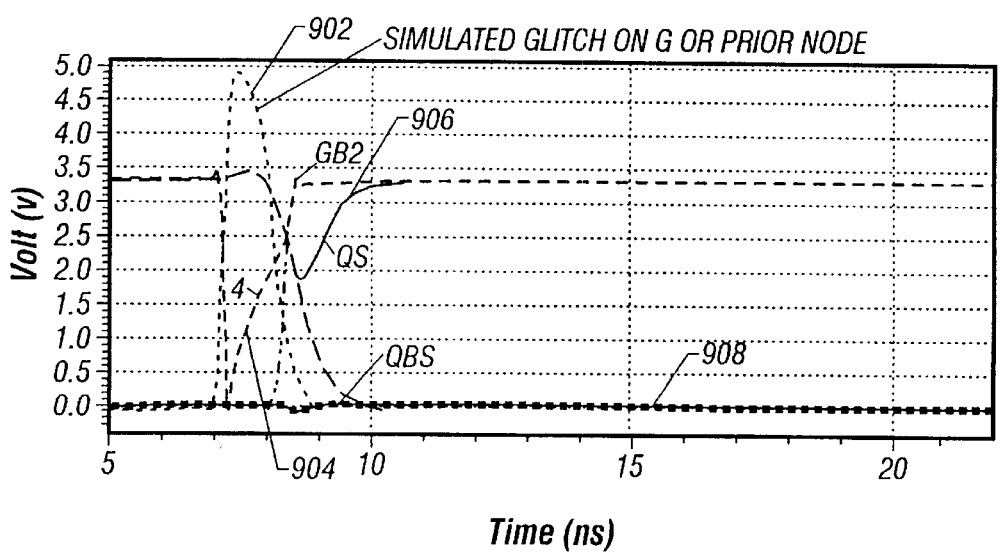

The performance of the circuit illustrated in FIG. 6 was verified using simulations as shown in FIGS. 8 and 9. In the first simulation, a glitch lasting about 0.7 ns (that is, the node spent 0.7 nanoseconds above the switching threshold, approximately the worst case glitch time for this node), as shown by curve 802, was simulated at node QBS. The glitch passes through output nodes Q and QB, producing curves 804 and 806, respectively. Since Q and QB are not loaded in this example (which is worst case for a glitch on QBS or QS), the circuits driving those nodes do not attenuate the glitch. In order to complete the feedback loop, however, the glitch must pass through the third delay incorporated in FETs 618 and 620, to node 4, producing curve 808, and through embedded delay 606 to node QS, by which time it is attenuated below the switching threshold, as shown in curve 810.

If a standard glitch about 1 ns long occurs on the input clock (G or GB), as shown by curve 902 in the simulation illustrated in FIG. 9, it is attenuated at node 4 (curve 904) and further attenuated at node QS (curve 906). The glitch never appears on node QBS (curve 908) and, consequently, does not appear on node Q or at the output of the flip flop.

Figure 10:
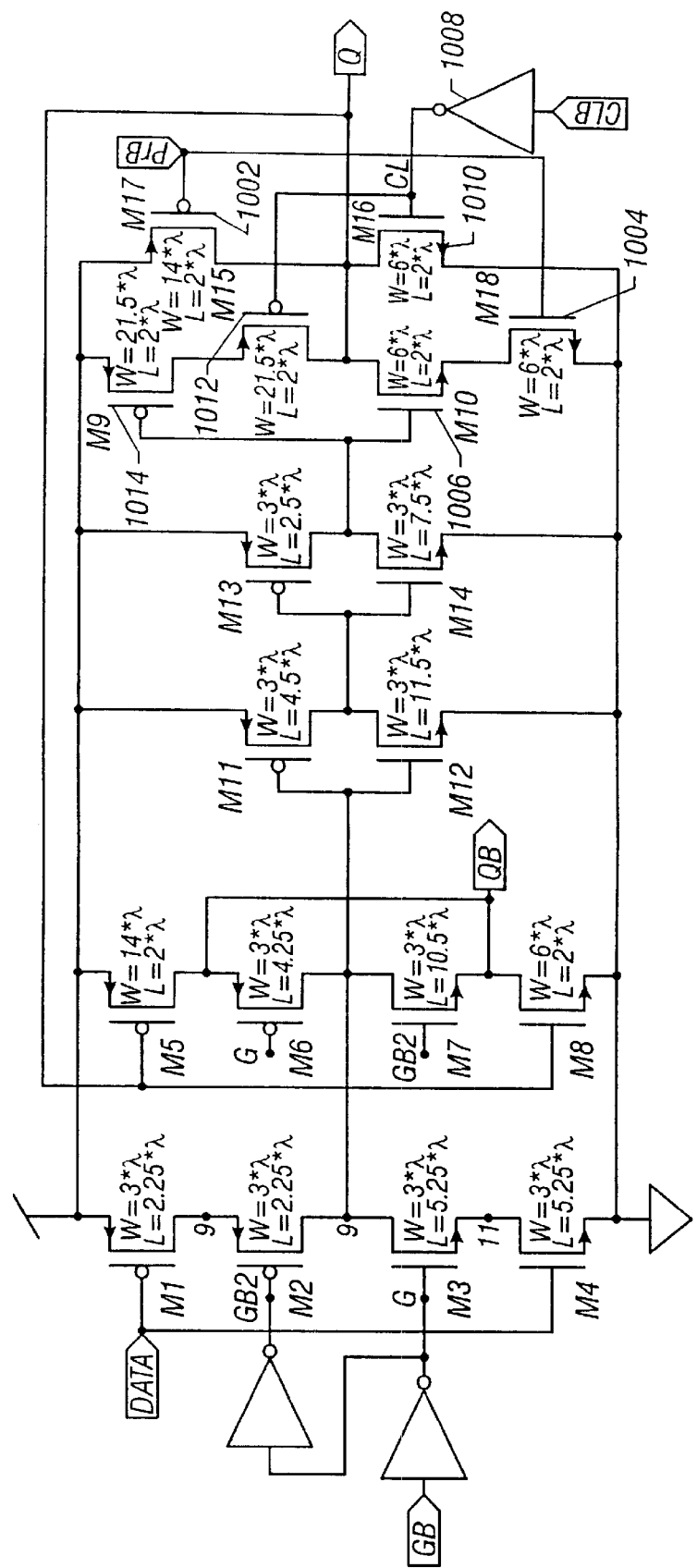
FIG. 10 is a schematic of a latch according to the present invention with asynchronous inputs.

As discussed above, the latch shown in FIG. 6 is glitch-resistant for glitches that appear on node Q. Consequently, "Preset" and "Clear" asynchronous inputs may be added to the circuit, as shown in FIG. 10. A PrB (Preset bar) input is coupled to the gates of a P-type FET 1002 and an N-type FET 1004. When the signal applied to PrB is low, FET 1002 is turned on and the Q node is raised high. FET 1004 decouples drive FET 1006 from the ground. When the signal applied to ClB (Clear bar) is low, the output of inverter 1008 is high which turns on FET 1010 and drives the Q node low. FET 1012 decouples drive FET 1014 from the Q node.

Figure 11A:
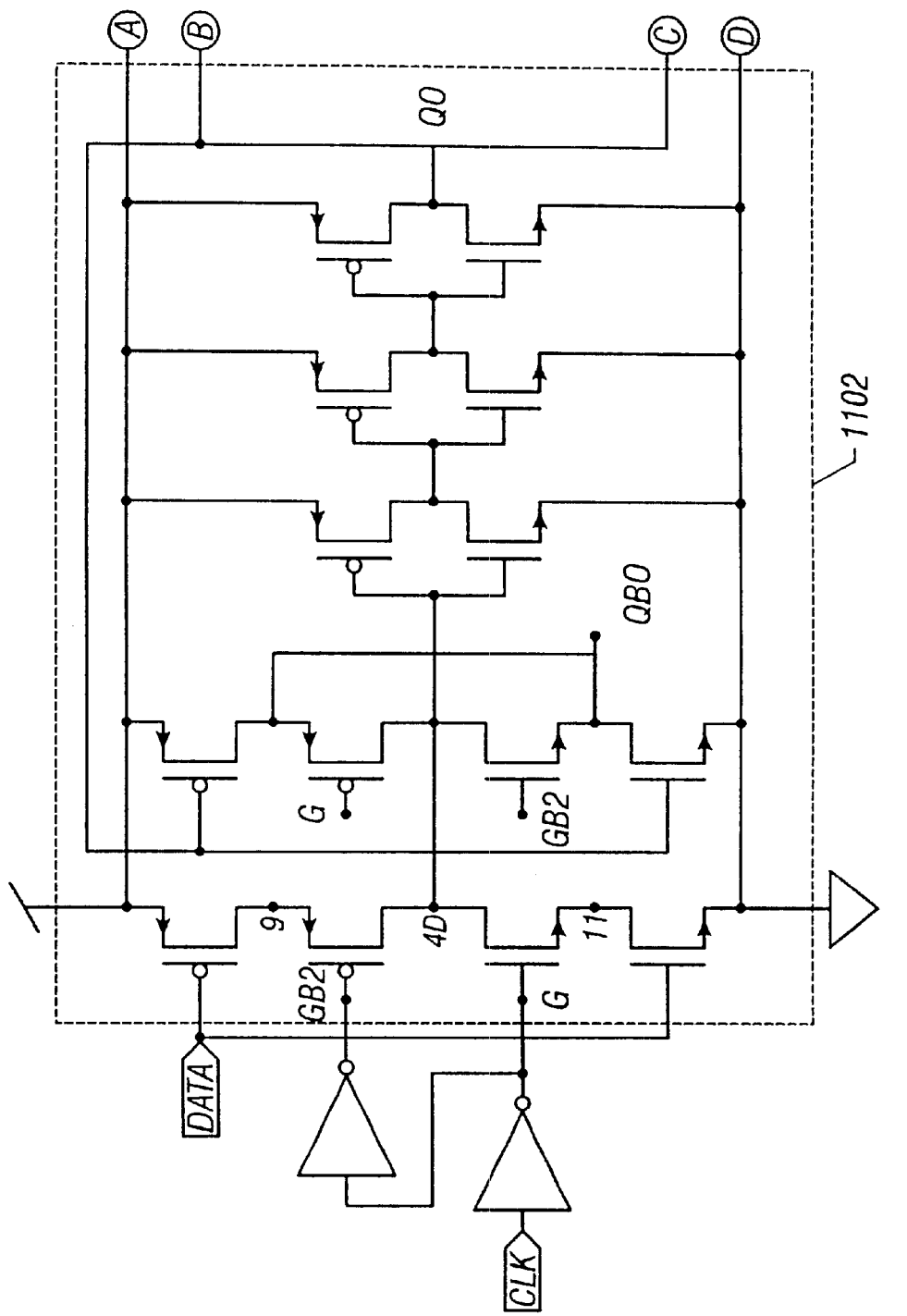
FIGS 11A and 11B are a schematic of a flip flop according to the present invention.
Figure 11B:
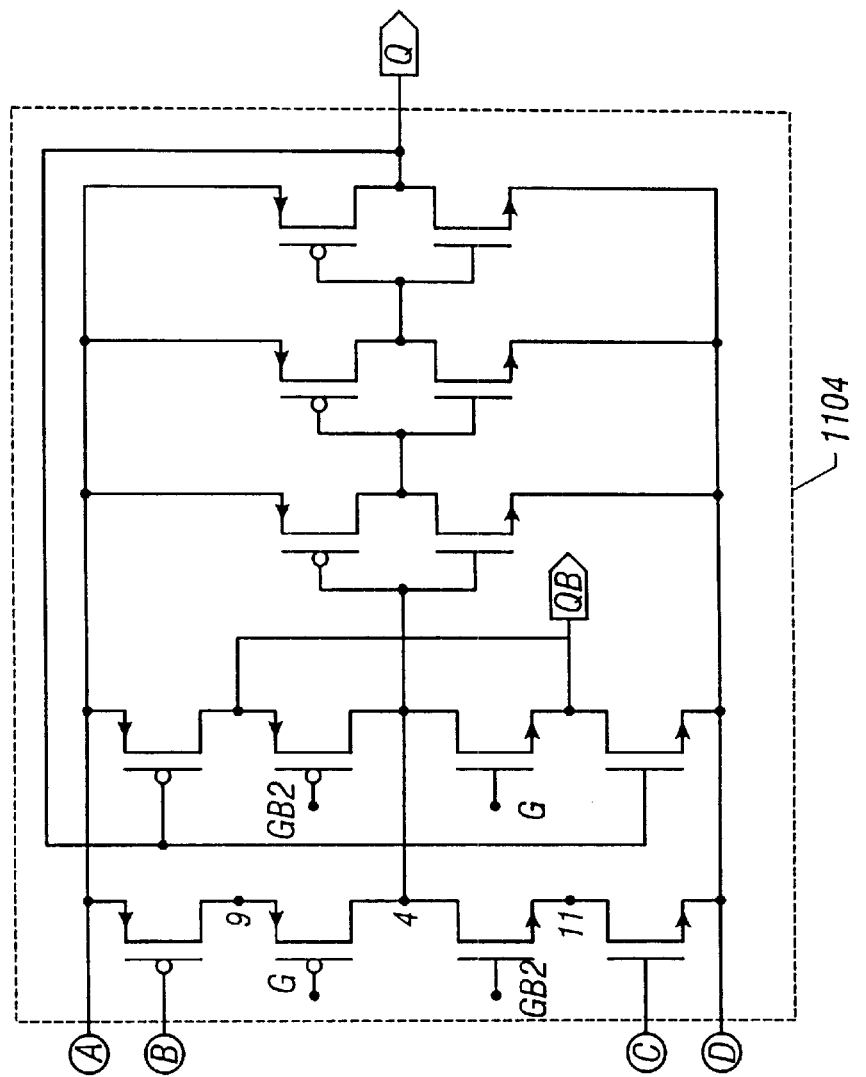

The latch illustrated in FIGS. 6 and 10 can be used to construct a variety of storage devices. Other devices, such as state machines, counters, and single-clock updateable registers, require a flip flop to operate correctly. As is understood by persons of ordinary skill in the art, a variety of flip flops, including J-K flip flops and D flip flops, can be constructed from a latch plus appropriate combinational logic. A D flip flop can be constructed from two latches 1102 and 1104 with the clock polarity reversed on the second latch 1104, as shown in FIGS. 11A and 11B. The two latches can be fully protected as shown in FIGS. 6 and 10, and preset and clear inputs can be added as shown in FIG. 10. Since the latch of FIG. 10 is protected against internal glitches on node Q, and since a glitch on the preset or clear inputs PrB and ClB would manifest itself as a glitch on node Q, then the latch is also protected against glitches on the preset and clear inputs.

Figure 12:
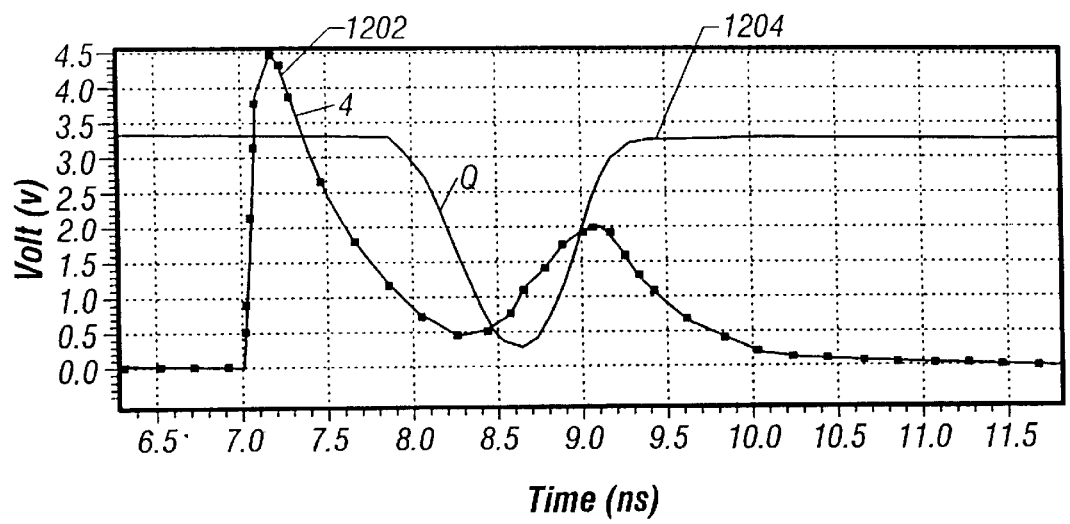
FIG. 12 is a chart showing the response of the latch of FIG. 6 to a glitch.

Returning to FIG. 6, it can be seen that the inverter 613 driving the Q output and the inverter 612 driving the QB output were kept "strong" (i.e. fast) so that they can drive the number of external loads that is standard for the logic family. In this configuration, the circuit's glitch tolerance is most challenged when Q and QB are both lightly loaded and a glitch occurs on node 4. As shown in FIG. 12, the glitch almost makes the circuit around the feedback loop to node 4 to reinforce itself (curve 1202), leaving only a 1.2 volt margin. The Q node (curve 1204) experiences a short excursion from its pre-glitch state.

More delay could be built into compact standard delays 606 or 608. However, this just creates a new critical node, that is, the node that is most susceptible to a glitch.

Figure 13:
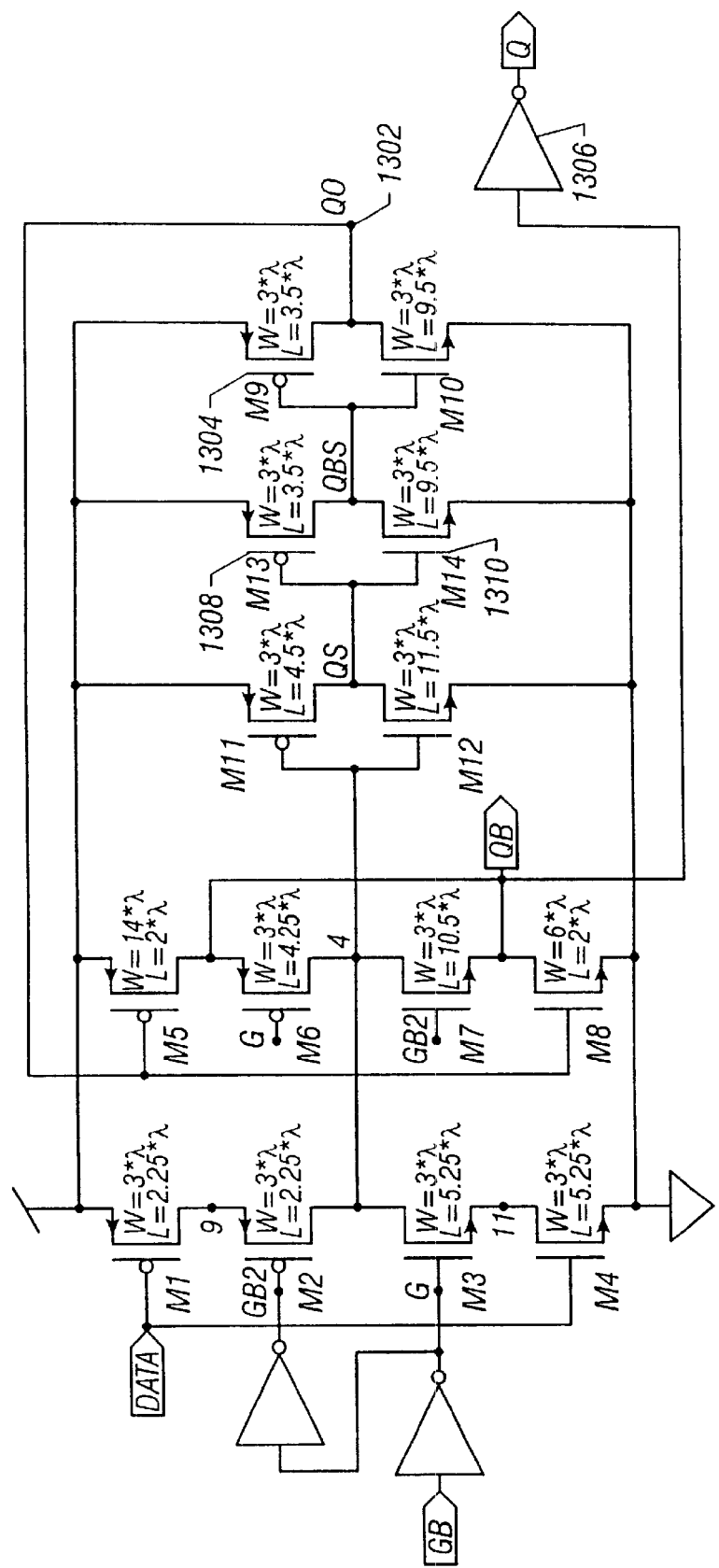
FIG. 13 is a schematic of a latch according to the present invention.
Figure 14:
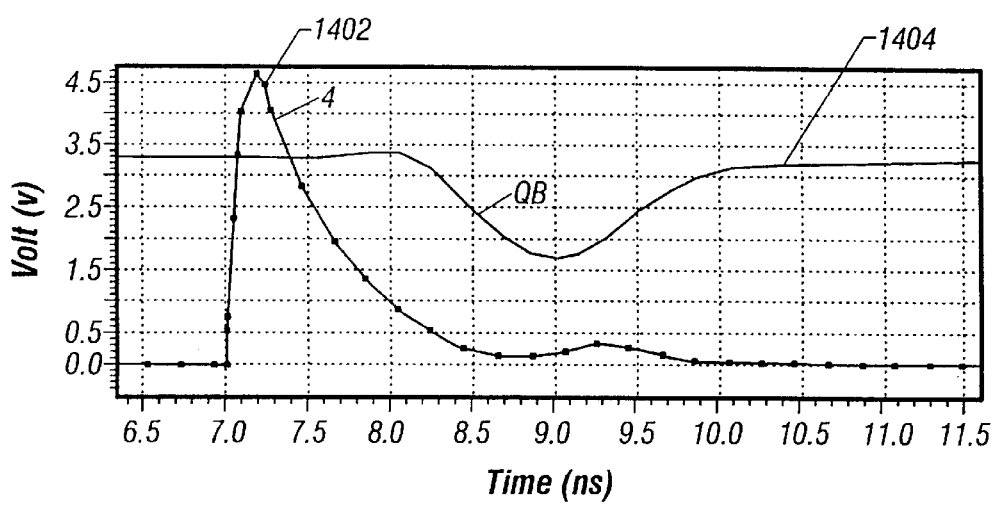
FIG. 14 is a chart showing the response of the latch of FIG. 13 to a glitch.

Another approach, illustrated in FIG. 13, is to introduce additional delay at node Q 1302 (renamed $Q_O$) by resizing FET 1304 as shown and deriving a new node Q by inverting node QB using inverter 1306. FETs 1308 and 1310 connected to node QS have been adjusted to accommodate the revised loading. As can be seen in FIG. 14, the revised circuit has a much smaller response to an even larger glitch (curve 1402). The $Q_O$ node experiences a smaller excursion with the revised circuit (curve 1404).

Figure 15:
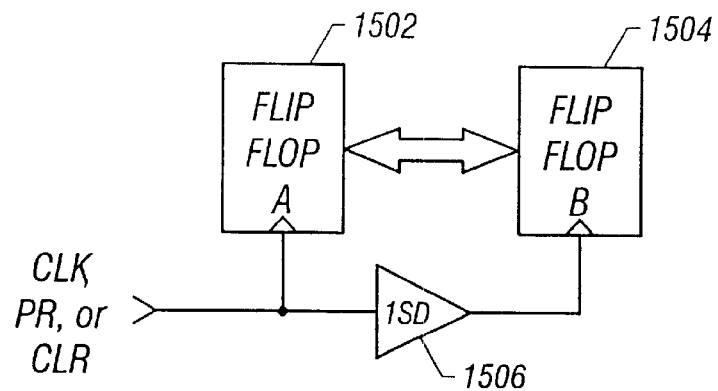
FIG. 15 is a block diagram of a cross-coupled flip flop according to the present invention.

Some devices employ two or more flip flops cross-coupled in such a way that none of the flip flops can change state unless they all change state, which protects against SEUs that occur within one of the flip flops. Such a device employing two cross-coupled flip flops 1502 and 1504 is illustrated in FIG. 15, in which, for simplicity only the clock signals and cross-coupling signals are shown. Protection against SEUs on the clock or asynchronous preset or clear lines that drive all of the flip flops can be added by inserting a compact standard delay 1506 on the line to be protected to one of the flip flops 1504.

Figure 16:
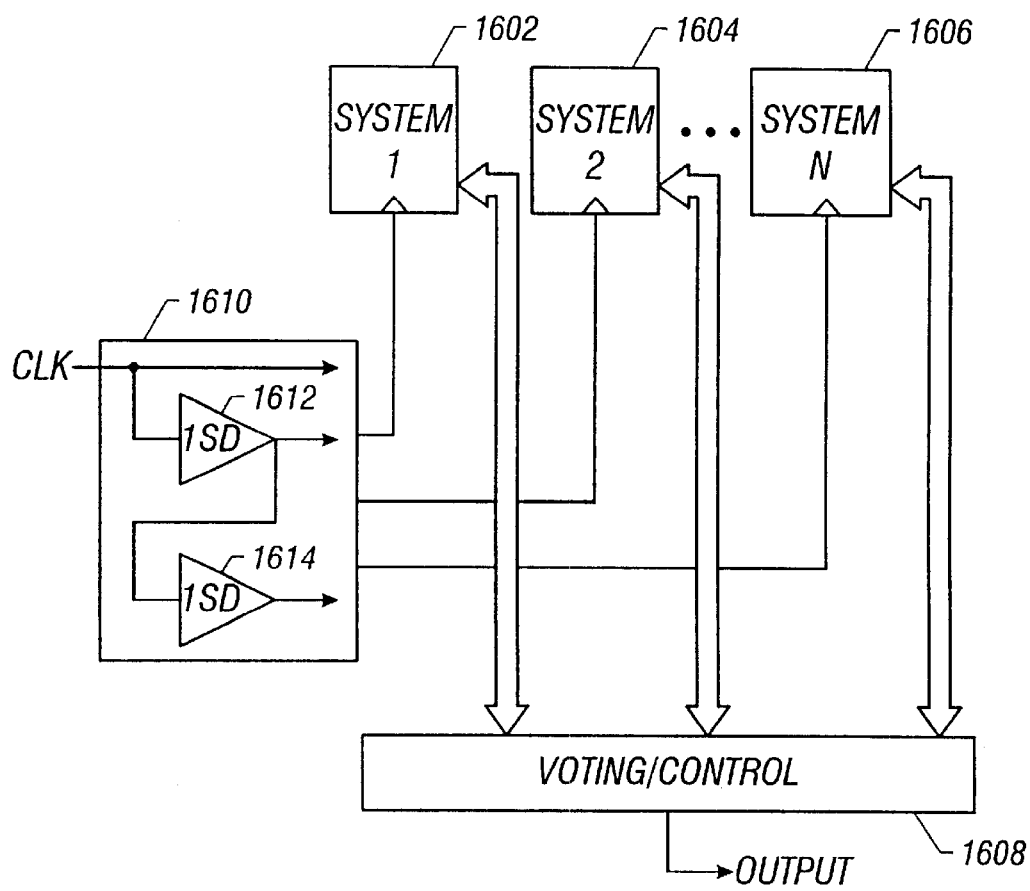
FIG. 16 is a block diagram of a plurality of systems cross-coupled through a voting/control block according to the present invention.

There are other systems, such as that illustrated in FIG. 16, in which the outputs of a plurality of N identical systems 1602, 1604, and 1606 are presented with the same inputs (not shown). The systems 1602, 1604, and 1606 can be latches, flip flops, microprocessors or other elements. The outputs of the N identical systems 1602, 1604, and 1606, which should be identical, are coupled to a voting/control element 1608 which chooses between them, using conventional techniques, to provide an output.

To prevent SEUs from affecting such a system, a clock generator circuit 1610 is provided which provides three clock outputs. The first clock output is an undelayed version of the clock input. The second clock output is delayed by compact standard delay 1612 and the third clock output is the second clock output delayed by another compact standard delay 1614. The three clock outputs are then distributed among the N systems 1602, 1604, and 1606 so that no one clock output feeds a majority of the N systems. The clock generator 1610 may be extended to any number of clock outputs by adding compact standard delays.

Figure 17:
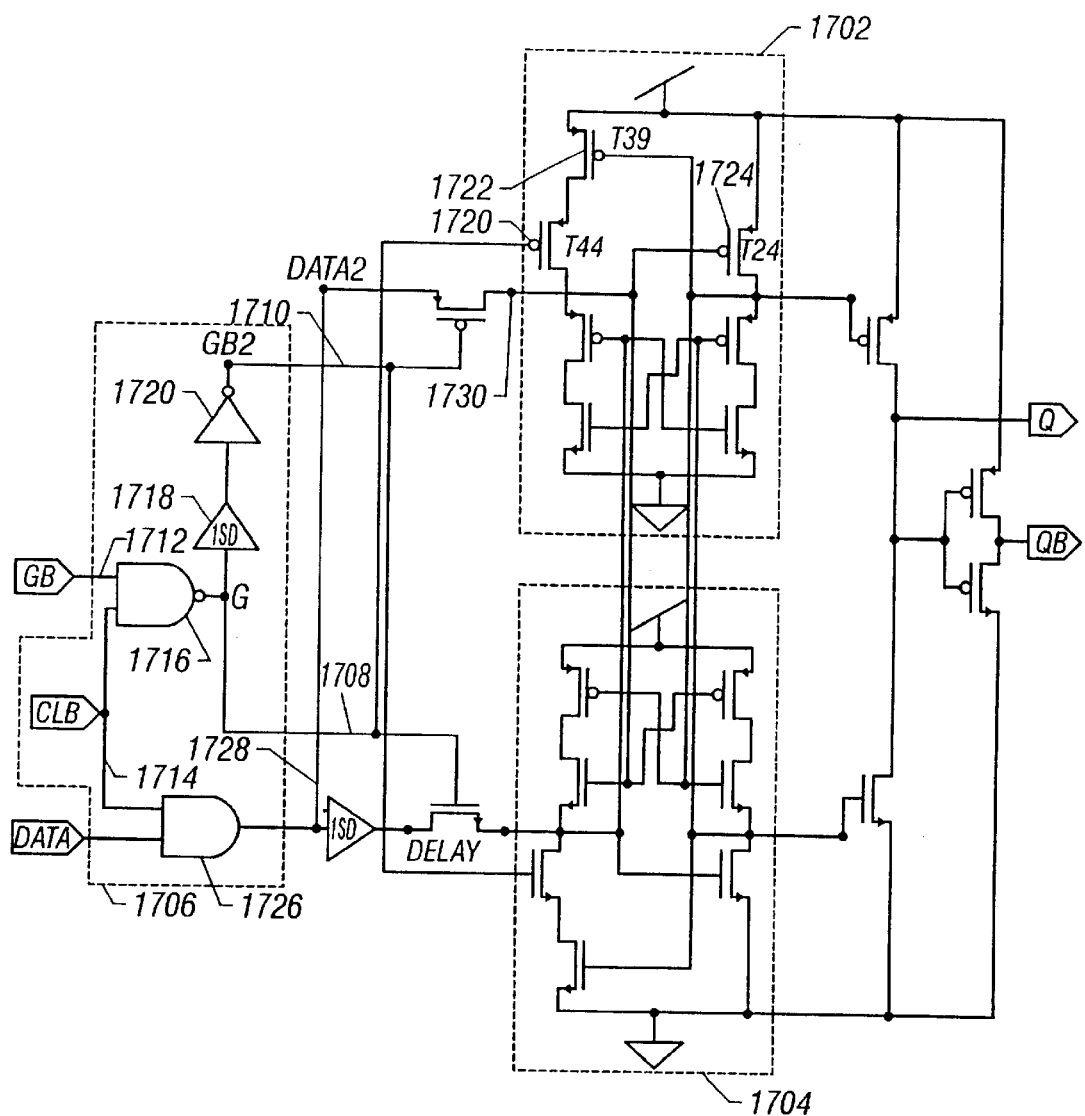
FIG. 17 is a schematic of a P and N cross-coupled flip flop according to the present invention.

Another device, illustrated in FIG. 17, uses cross-coupled P- and N-type latches, 1702 and 1704, respectively. Because of the cross coupling between the latches, a glitch originating at a node within one of the latches is tolerated. Without the additions 1706 shown in FIG. 17, however, the device is vulnerable to glitches on the clock inputs G 1708 or GB 1710 and is not readily configured to accept a preset or clear signal.

The additions illustrated in FIG. 17 derive the two clock signals G 1708 and GB2 1710 from a single clock signal 1712. As long as the clear signal CLB 1714 is high, the GB signal 1712 is inverted by NAND gate 1716 to produce clock signal G 1708. The G signal is delayed by compact standard delay 1718 and inverted by inverter 1720 to produce clock signal GB2 1710. The compact standard delay 1718 insures that a glitch on one of the clock signals will not arrive simultaneously at the two flip flops 1702 and 1704.

The effect of a glitch on the clock line can be compared to glitches on the two data lines in quick succession. The flip flop is designed to resist such glitches, but not in quick succession. In such a case it has not quite recovered from an ambiguous state during the arrival of the delayed clock signal to the upper flip flop. Resizing FETs 1720 and 1722 to be four times their original size and FET 1724 to be one-quarter its original size eliminates the ambiguity before it can cause an upset.

A clear input 1714 is added by having a low signal on the C1B input 1714 drive the output of AND gate 1726 low so that it appears that the Data input to the flip flops 1728 is low. The low signal on the clear input 1714 also triggers the clocks G 1708 and GB 1710 by driving the output of the NAND gate 1716 low.

Figure 18:
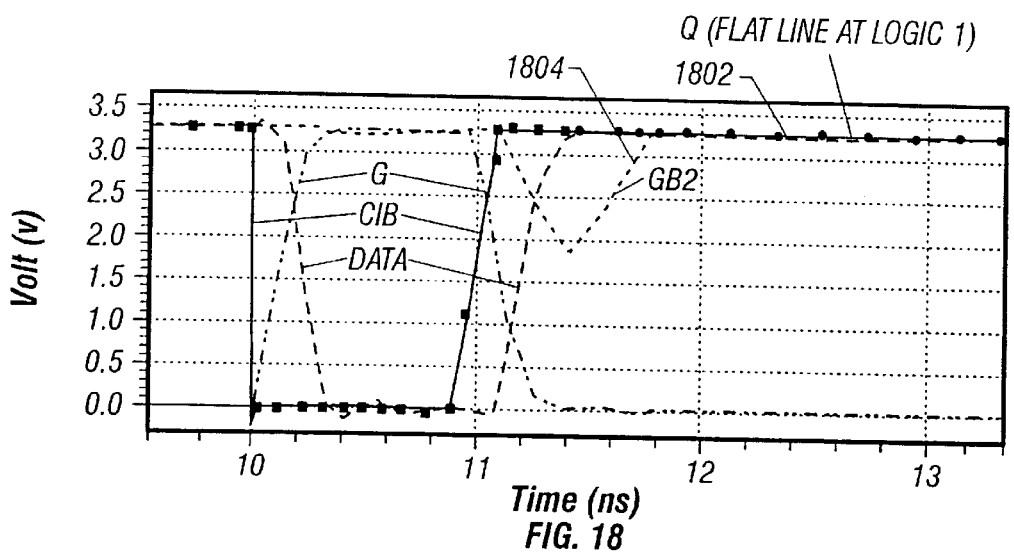
FIG. 18 is a chart of the response of the cross-coupled flip flop of FIG. 17 to a glitch.
Figure 19:
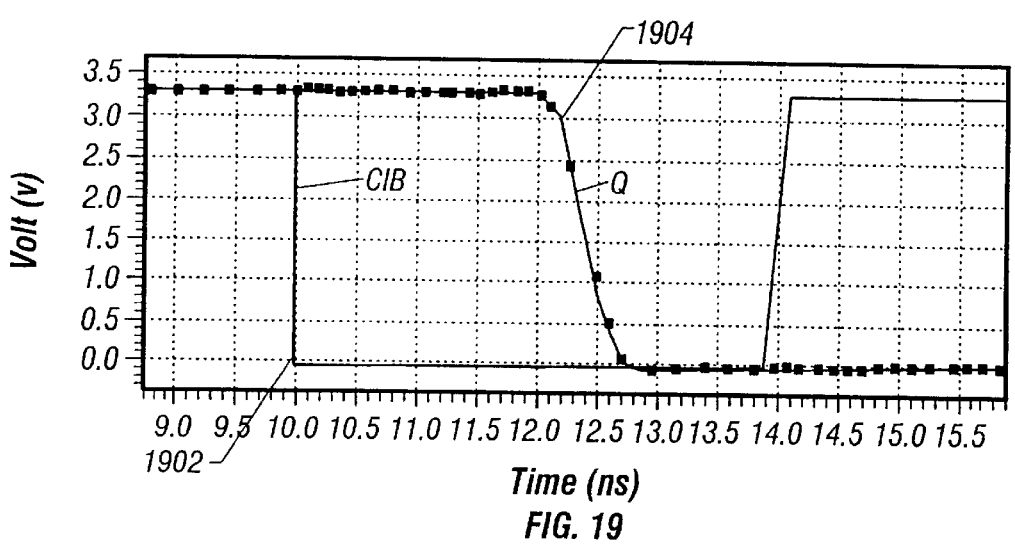
FIG. 19 is a chart of the response of the cross-coupled flip flop of FIG. 17 to a standard clock pulse.

Simulation results, illustrated in FIG. 18, show that the Q output 1802 is completely non-responsive to a 1 ns glitch 1804 on the C1B signal. When a true clock signal 1902 is applied to the C1B input 1712, as shown in FIG. 19, the flip flops change state within 2.5 ns as reflected by the signal on the Q output 1904. Thus, the degradation in speed in return for SEU-resistance is quite small.

Figure 20:
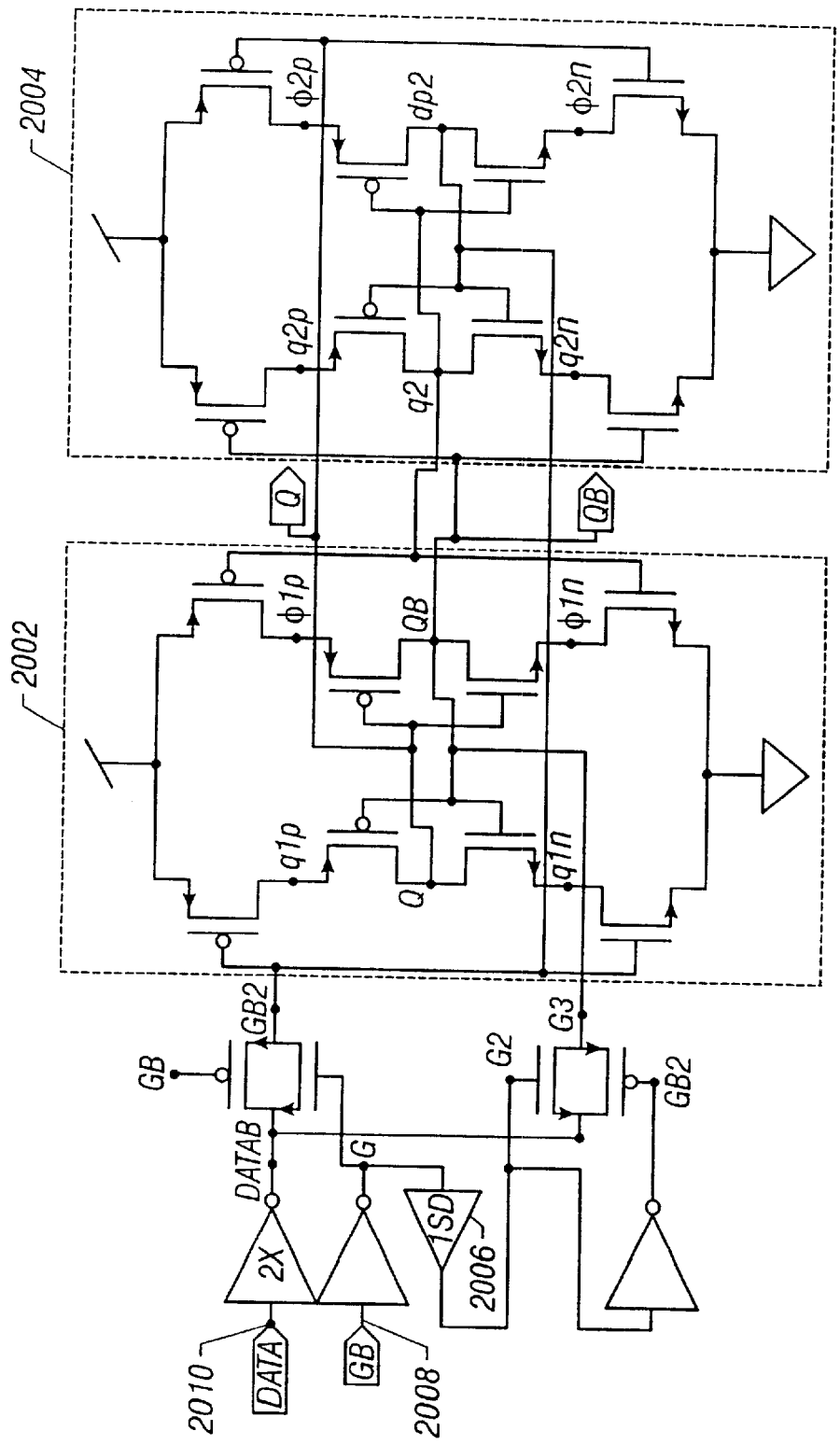
FIG. 20 is a schematic of a bias-coupled flip flop according to the present invention.
Figure 21:
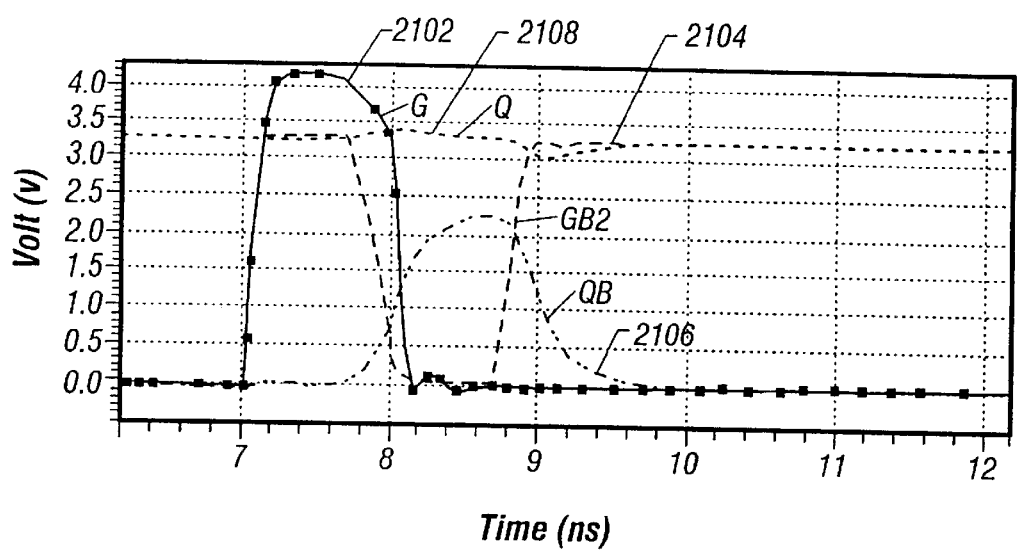
FIG. 21 is a chart of the response of the bias-coupled flip flop of FIG. 20 to a glitch.

In still another circuit, illustrated in FIG. 20, the bias-coupled latches 2002 and 2004 are rendered resistant to clock line glitches by the addition of a compact standard delay 2006 on the clock line GB 2008. A separate delay on the data line 2010 is not necessary because the flip flop latches the data at the end of the clock pulse (the rising edge of the signal on the clock line GB 2008). By delaying the clock to one portion of the flip flops, the data is already sampled at a different time and no further delay is necessary. The bias-coupled latches 2002 and 2004 could have clear and/or preset inputs added as shown in FIG. 9. FIG. 21 illustrates the response of the circuit in FIG. 20 to a glitch 2102 on the clock line G. The signal 2104 on the GB node is affected and the signal 2106 on the QB node is perturbed, but the signal 2108 on the Q output remains stable.

In a traditional logic gate, CMOS transistors are stacked in series on one side of the output and in parallel on the other side, as shown in FIGS. 7A and 7B. This type of structure forms the ordinary Boolean functions, which provide a fixed output in response to the current state of the inputs, without regard for the current state of the gate. The circuits described above (delays and inverters and protected latch circuits employing them) take advantage of the fact that they store their current states for some period of time, principally in node parasitic capacitance. Such circuits can be extended beyond inverters and delays, and give rise to a new kind of logic gate.

Figure 22:
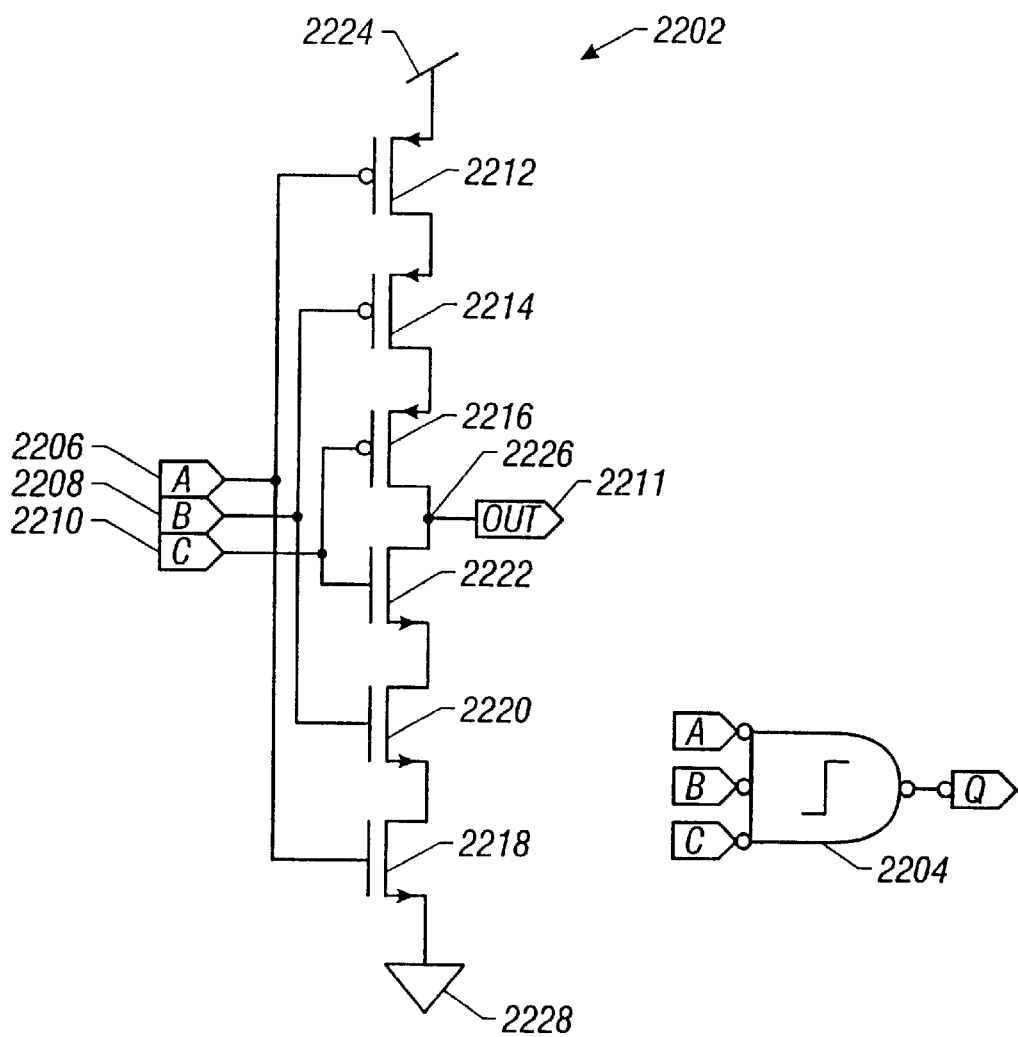
FIG. 22 is a schematic of a three-input transition NAND gate and a representation of the symbol for a TAG.

A three-input transition NAND gate ("TAG") 2202, illustrated in FIG. 22 and represented by symbol 2204, has three inputs 2206, 2208, and 2210 and one output 2211. Each of the inputs 2206, 2208, and 2210 is coupled to a P-type FET, 2212, 2214, and 2216, respectively, and to an N-type FET, 2218, 2220, and 2222, respectively. The P-type FETs are connected in series as are the N-type FETs. One end of the chain of P-type FETs is connected to the supply and the other end is connected to one end of the N-type FETs at node 2226. The other end of the chain of N-type FETs is connected to ground 2228.

If the output of TAG 2202 is coupled only to capacitive loads or if the gate is followed with a buffer, the TAG 2202 will only transition from one logic state to the other when all of its inputs have transitioned. That is, TAG 2202 will transition from a logic state where its output is high to one where its output is low only when all of the inputs 2206, 2208 and 2210 to the TAG 2002 have dropped low. Similarly, TAG 2202 will transition from a logic state where its output is low to one where its output is high only when all of the inputs 2206, 2208 and 2210 to the TAG 2002 are high.

The TAG accomplishes this by storing its current state on the parasitic capacitance on node 2226. This stored state will not change until all three inputs 2206, 2208 and 2210 agree. For example, if the stored state of the TAG is low and inputs 2206 and 2208 are high but input 2210 is low, then the output node 2226 will be disconnected from both the supply (by FETs 2212 and 2214) and ground (by FET 2222) so its parasitic capacitance will keep it in the low state. If the input 2210 is raised high, the output node 2226 will be connected to the supply 2224 through the three P-type FETs 2212, 2214 and 2216 and it will be charged to a high state. Persons of ordinary skill in the art will recognize that a TAG can have any number of inputs and can be arranged in different ways to accomplish the same purpose. For example, a 4-input TAG would require an additional P-type FET and an additional N-type FET. A TAG that changes state when two inputs agree or when one input changes state could be made by placing one of the P-type FETs in parallel with the other two and one of the N-type FETs in parallel with the other two. Other similar modifications could be made to create a variety of such devices.

This feature of the variety of TAG illustrated in FIG. 22, that it does not change state until all of its inputs are the same, makes it a good candidate for use in making a circuit SEU-resistant. The TAG itself must be made SEU-resistant to avoid upsets caused by radiation hits at the output node 2226, for example.

Figure 23:
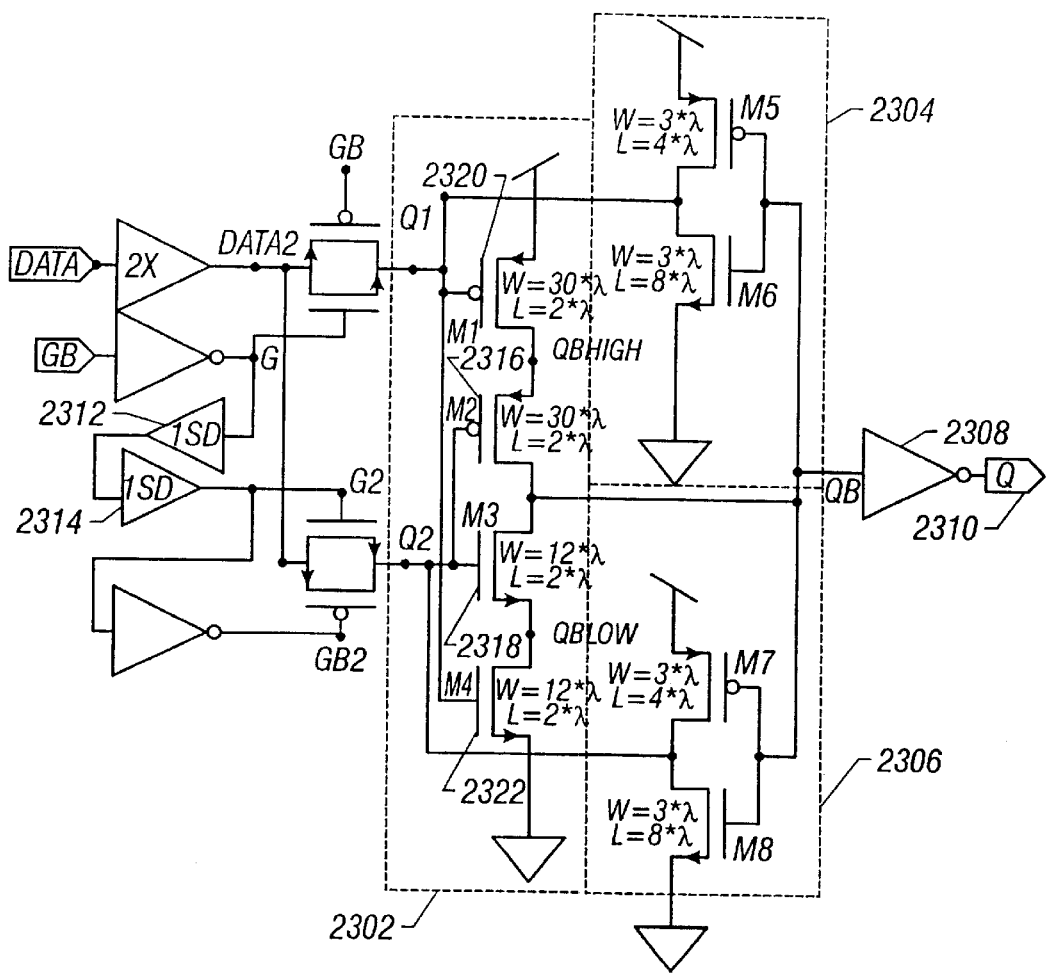
FIG. 23 is a schematic of a TAG latch according to the present invention.

An SEU-resistant circuit incorporating a TAG, illustrated in FIG. 23, includes a two-input TAG 2302 and two embedded delays 2304 and 2306. If a glitch occurs in either of the delays 2304 or 2306, i.e. on nodes Q1 or Q2, the TAG does not allow node QB to change state, and QB quickly drives the erroneous inverter back to the correct state.

Figure 24:
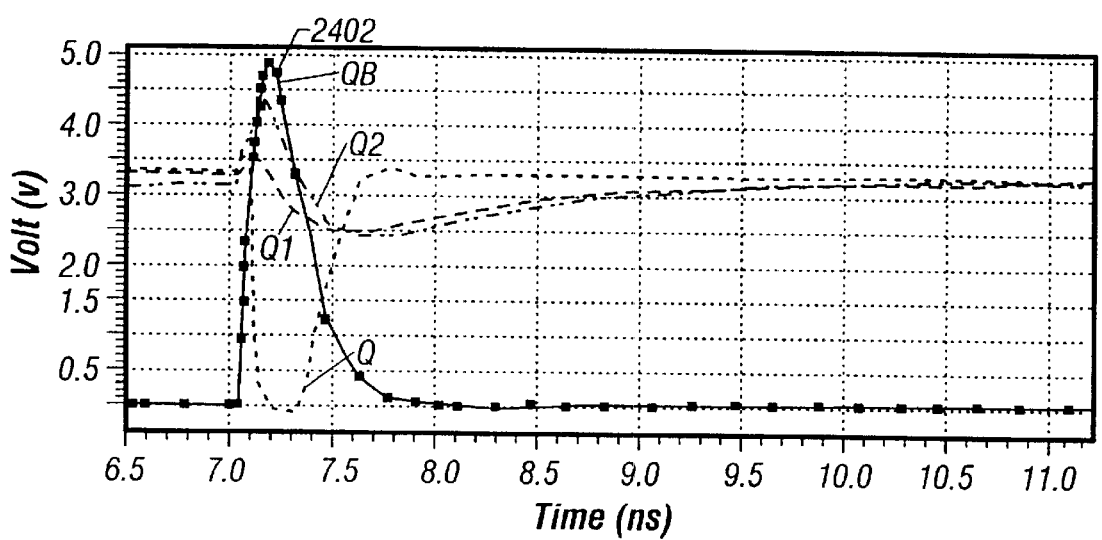
FIG. 24 is a chart showing the response of the latch of FIG. 23 to a glitch.

If radiation strikes the TAG itself, causing a glitch at QB, the delays 2304 and 2306 are sized to provide a slight delay in propagating the glitch. Before the glitch can reach nodes Q1 or Q2, the TAG has driven node QB back into the correct state. This behavior assumes known, controlled loads at Q1, Q2 and QB, so a buffer 2308 is used to derive an output Q 2310. Simulation results, illustrated in FIG. 24, show the results of a glitch 2402 on QB. Q, Q1 and Q2 are all affected, but within half a nanosecond all nodes have recovered to their correct states.

Due to the small number of transistors in the basic flip flop illustrated in FIG. 23 (only four, exclusive of the drive circuitry), this circuit may be suitable for use in a small memory array, such as for a register file or cache. In such array, each individual cell is SEU-resistant, lessening the need for error correcting codes or extra unprotected cells. For a small array, the size of the memory cells might be offset by eliminating the extra protection circuitry.

The compact standard delays 2312 and 2314 are necessary because a signal on the inputs to the central pair of transistors 2316 and 2318 in the TAG have a slight coupling to the QB node. This coupling causes weak drive on the slow inverters and a long recovery time. The extra clock circuit delay (2 standard delays) completely absorbs any clock glitch. Otherwise, the propagation of the glitch to the second input would catch the flip flop in a weakened state and upset it.

This problem can also be alleviated by observing that a clock glitch will always strike the Q1 node first (because the path to the Q1 node does not include the delays) and connecting the Q1 node to the outer pair of transistors 2320 and 2322 rather than the central pair 2316 and 2318. Since the outer pair of transistor 2320 and 2322 is separated from the QB node by the inner pair of transistors 2316 and 2318, a glitch on the outer pair is less likely to affect the QB node. A glitch in the clock delays 2312 or 2314 would only strike Q2 and there would be no following strike on Q1.

Figure 25:
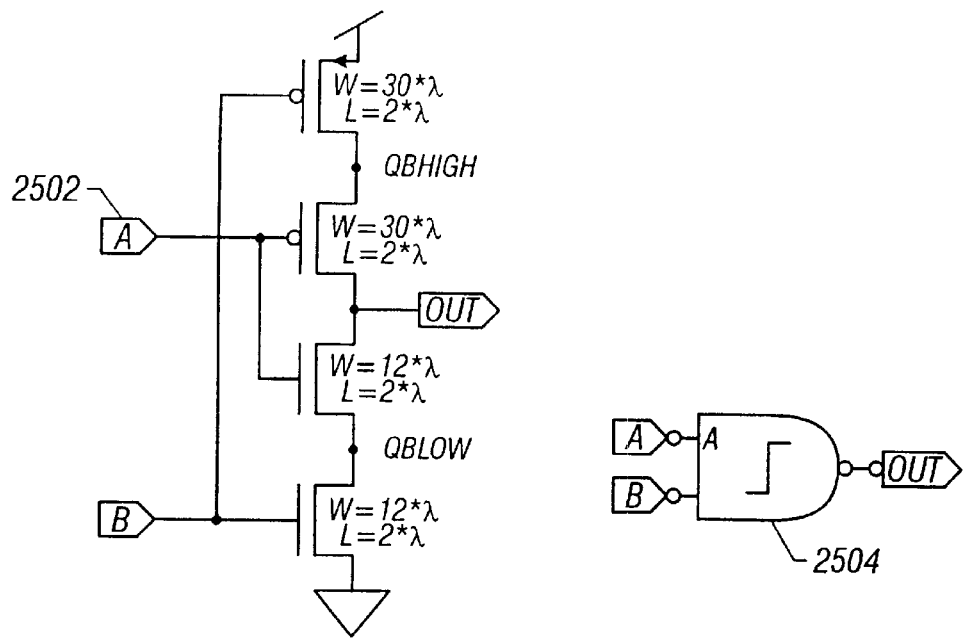
FIG. 25 is a schematic of a two-input transition NAND gate and a representation of the symbol for a TAG.

The TAG could be wired so that one each of the inner pair and outer pair of transistors is used for each of the inputs, but then both inputs would be vulnerable. It is more advantageous to associate the vulnerability with one input 2502, as shown in FIG. 25, and designate the vulnerable input with a designation, such as a small "A," on the symbol 2504.

Figure 26:
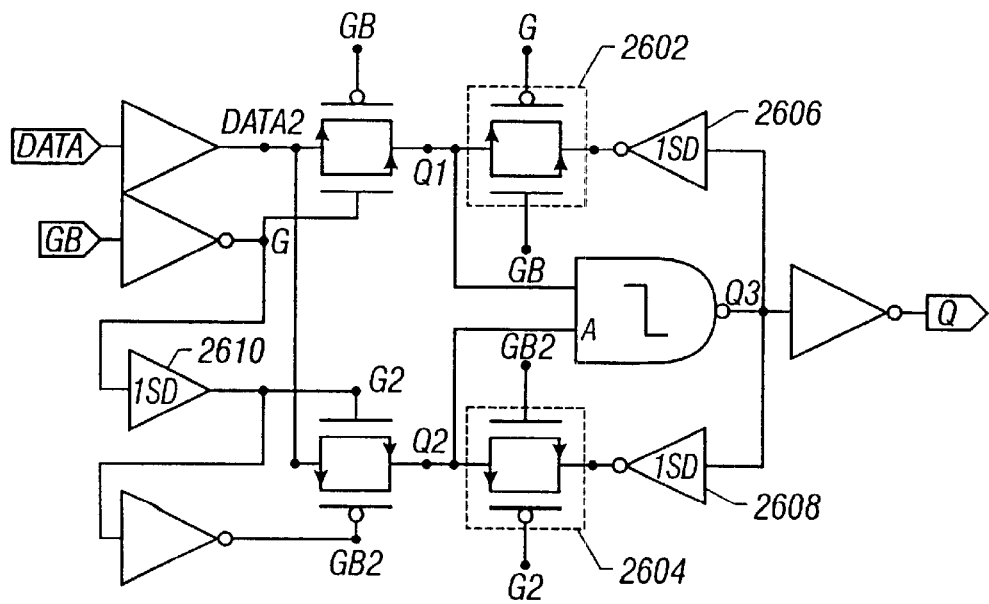
FIG. 26 is a schematic of a latch according to the present invention.

If the simplified bias coupled flip flop shown in FIG. 23 is to be used as a logic flip flop rather than as a memory cell, the node fights on the Q1 and Q2 nodes during setting of the flip flop should be eliminated, as shown in FIG. 26, by the addition of transmission gates 2602 and 2604 to the feedback loops. Further, the Q1 node is connected to the outer transistor pair of the TAG. Finally, the feedback loops include compact standard delays 2606 and 2608, rather than the embedded delays 2312 and 2314 shown in the clock circuit in FIG. 23, and the input clock delay is returned to one compact standard delay 2310. This arrangement gives operating characteristics roughly similar to the circuits described above and a high margin for a delay-based design.

Figure 27:
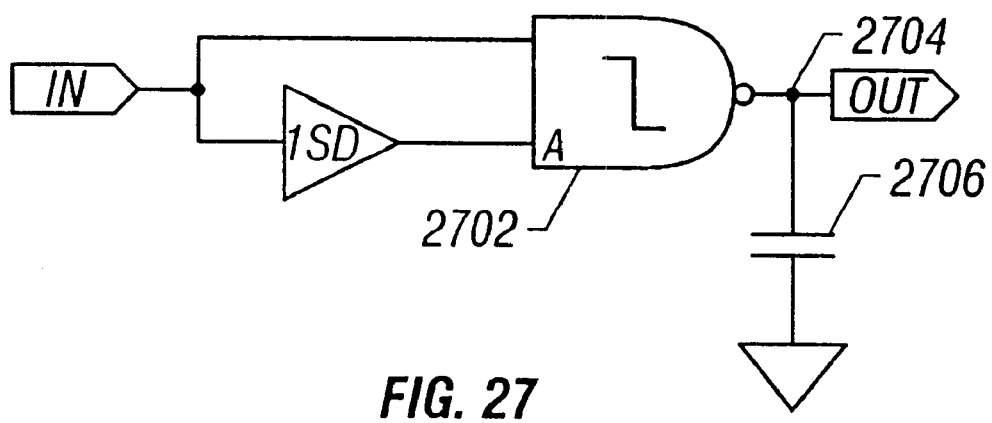
FIG. 27 is a schematic of a TAG glitch-removing circuit according to the present invention.

The TAG can also be used to create a circuit that removes glitches from a signal, as illustrated in FIG. 27. This is done by delaying the signal to one of the TAG inputs, so that in response to a glitch in the signal the TAG never sees both inputs in the same state (the first input has recovered by the time the glitch propagates to the second input), and thus the TAG never changes state. For this to be completely effective, the TAG may be modified so that it, itself, is not vulnerable to glitches. For example, the transistors in the TAG 2702 may be increased in size so that it produces a glitch-free signal from one that originally included standard glitches. Alternatively, the capacitance at the TAG's 2702 output node 2704 could be made large enough to absorb a glitch, either by adjusting the parameters of the TAG itself, or by adding an outside capacitor 2706.

What is claimed is:

1. A transition NAND gate comprising:

two or more input nodes;

an output node;

circuitry responsive to the two or more input nodes;

the circuitry being capable of transitioning from a most recent current state to a state that is not a current state;

the output node storing the current state of the circuitry, wherein the circuitry comprises:

a supply-side FET for each input terminal, the gate of each supply-side FET being connected to a respective input terminal, the supply-side FETs being connected in series, the series-connected supply-side FETs having a supply end and an output end;

a ground-side FET for each input terminal, the gate of each ground-side FET being connected to a respective input terminal, the ground-side FETs being connected in series, the series-connected ground-side FETs having a ground end and an output end;

the output end of the series-connected supply-side FETs being connected to the output end of the series connected ground-side FETs to form an output terminal, wherein said circuitry comprises a state machine.

2. The transition NAND gate of claim 1 wherein the supply-side FETs are P-type FETs; and the ground-side FETs are N-type FETs.

* * * * *